(12) United States Patent
Yamazaki et al.

(10) Patent No.: US 7,513,949 B2
(45) Date of Patent: Apr. 7, 2009

(54) METHOD AND APPARATUS FOR PRODUCING SEMICONDUCTOR DEVICE

(75) Inventors: Shunpei Yamazaki, Tokyo (JP); Koichiro Tanaka, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 11/124,053

(22) Filed: May 9, 2005

(65) Prior Publication Data

US 2005/0214991 A1    Sep. 29, 2005

Related U.S. Application Data

(62) Division of application No. 09/304,523, filed on May 4, 1999, now Pat. No. 6,902,616, which is a division of application No. 08/683,722, filed on Jul. 18, 1996, now Pat. No. 5,907,770.

(30) Foreign Application Priority Data

| Jul. 19, 1995 | (JP) | .................... 7-205379 |
| Jul. 31, 1995 | (JP) | .................... 7-215406 |
| Aug. 4, 1995 | (JP) | .................... 7-219533 |
| Aug. 18, 1995 | (JP) | .................... 7-233306 |

(51) Int. Cl.
    *C30B 1/04*    (2006.01)
(52) U.S. Cl. .................... 117/201; 117/202; 118/715; 118/718; 118/719
(58) Field of Classification Search ............. 117/201, 117/202; 118/715, 718, 719, 720
    See application file for complete search history.

(56) References Cited

U.S. PATENT DOCUMENTS

| 4,059,428 A | 11/1977 | Andrews |
| 4,177,372 A | 12/1979 | Kotera et al. |
| 4,406,709 A | 9/1983 | Celler et al. |
| 4,929,060 A | 5/1990 | Sugimoto et al. |
| 5,252,140 A | 10/1993 | Kobayashi et al. |
| 5,254,208 A | 10/1993 | Zhang |
| 5,292,355 A | 3/1994 | Nikander |
| 5,294,238 A | 3/1994 | Fukada et al. |
| 5,383,990 A | 1/1995 | Tsuji |

(Continued)

FOREIGN PATENT DOCUMENTS

DE        3731558        4/1989

(Continued)

*Primary Examiner*—Robert M Kunemund
(74) *Attorney, Agent, or Firm*—Fish & Richardson P.C.

(57) ABSTRACT

An amorphous silicon film is formed on a flat glass substrate, and then crystallized by heating to obtain a crystalline silicon film. The glass substrate is placed on a stage having a convex U-shaped curved surface. The glass substrate is heated for a desired period of time at a temperature close to a strain point of the glass substrate, and then is cooled. Also, an amorphous silicon film formed on a glass substrate is crystallized into a crystalline silicon film by heating and then the glass substrate is mounted on a stage having a flat surface in such a manner that the lower surface of the glass substrate is in close contact with the flat surface of the stage by pressing the upper surface of the glass substrate. Then, a linear laser beam is irradiated on the crystalline silicon film in a scanning manner.

24 Claims, 14 Drawing Sheets

U.S. PATENT DOCUMENTS

| | | |
|---|---|---|
| 5,413,958 A | 5/1995 | Imahashi et al. |
| 5,481,121 A | 1/1996 | Zhang et al. |
| 5,492,842 A | 2/1996 | Eytcheson et al. |
| 5,492,843 A | 2/1996 | Adachi et al. |
| 5,559,042 A | 9/1996 | Yamazaki et al. |
| 5,585,291 A | 12/1996 | Ohtani et al. |
| 5,708,252 A | 1/1998 | Shinohara et al. |
| 5,756,364 A | 5/1998 | Tanaka et al. |
| 5,824,573 A | 10/1998 | Zhang et al. |
| 5,837,619 A | 11/1998 | Adachi et al. |
| 5,854,803 A | 12/1998 | Yamazaki et al. |
| 5,869,362 A | 2/1999 | Ohtani |
| 5,869,387 A | 2/1999 | Sato et al. |
| 5,879,977 A | 3/1999 | Zhang et al. |
| 5,907,770 A | 5/1999 | Yamazaki et al. |
| 6,059,873 A | 5/2000 | Yamaguchi et al. |
| 6,165,876 A | 12/2000 | Yamazaki et al. |
| 6,242,292 B1 | 6/2001 | Yamazaki et al. |
| 6,300,176 B1 | 10/2001 | Zhang et al. |
| 6,353,244 B1 | 3/2002 | Yamazaki et al. |
| 6,524,977 B1 | 2/2003 | Yamazaki et al. |
| 6,596,613 B1 | 7/2003 | Kusumoto et al. |
| 6,902,616 B1 | 6/2005 | Yamazaki et al. |
| 7,303,980 B2 | 12/2007 | Yamazaki et al. |
| 2005/0214991 A1 | 9/2005 | Yamazaki et al. |
| 2007/0141768 A1 | 6/2007 | Yamazaki et al. |

FOREIGN PATENT DOCUMENTS

| | | |
|---|---|---|
| JP | 59-193022 | 11/1984 |
| JP | 60-257511 | 12/1985 |
| JP | 63-090386 | 4/1988 |
| JP | 63-123015 | 5/1988 |
| JP | 63-224317 | 9/1988 |
| JP | 01-214042 | 8/1989 |
| JP | 02-101426 | 4/1990 |
| JP | 03-286518 | 12/1991 |
| JP | 05-166817 | 7/1993 |
| JP | 06-244104 | 9/1994 |
| JP | 06-292988 | 10/1994 |
| JP | 07-074366 | 3/1995 |
| JP | 07-136885 | 5/1995 |
| JP | 07-146470 | 6/1995 |
| JP | 07-161635 | 6/1995 |
| JP | 07-183366 | 7/1995 |
| JP | 07-237765 | 9/1995 |
| JP | 08-274148 | 10/1996 |
| JP | 09-036374 | 2/1997 |

NUMBER → 1 2 3 4 5    396 398 400
                      397 399

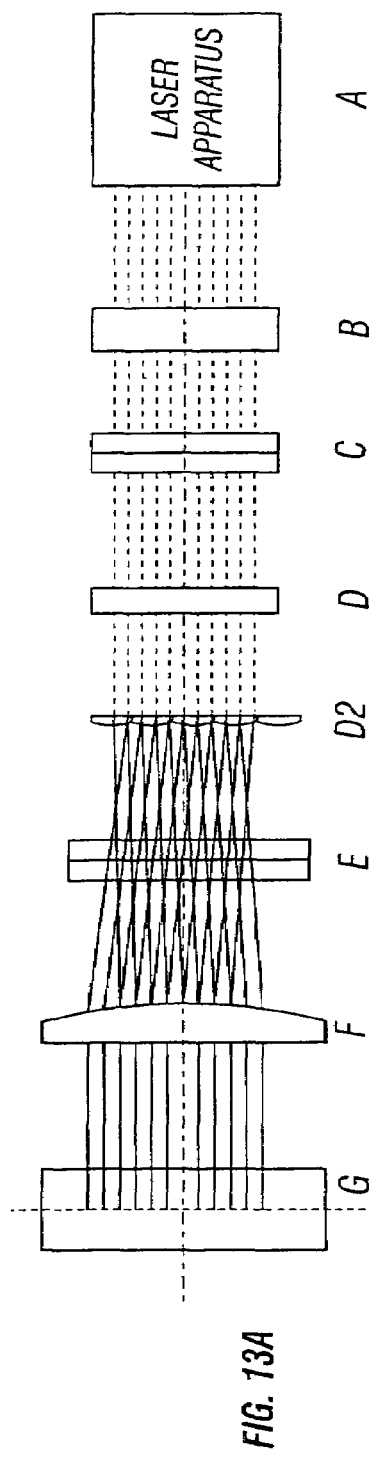
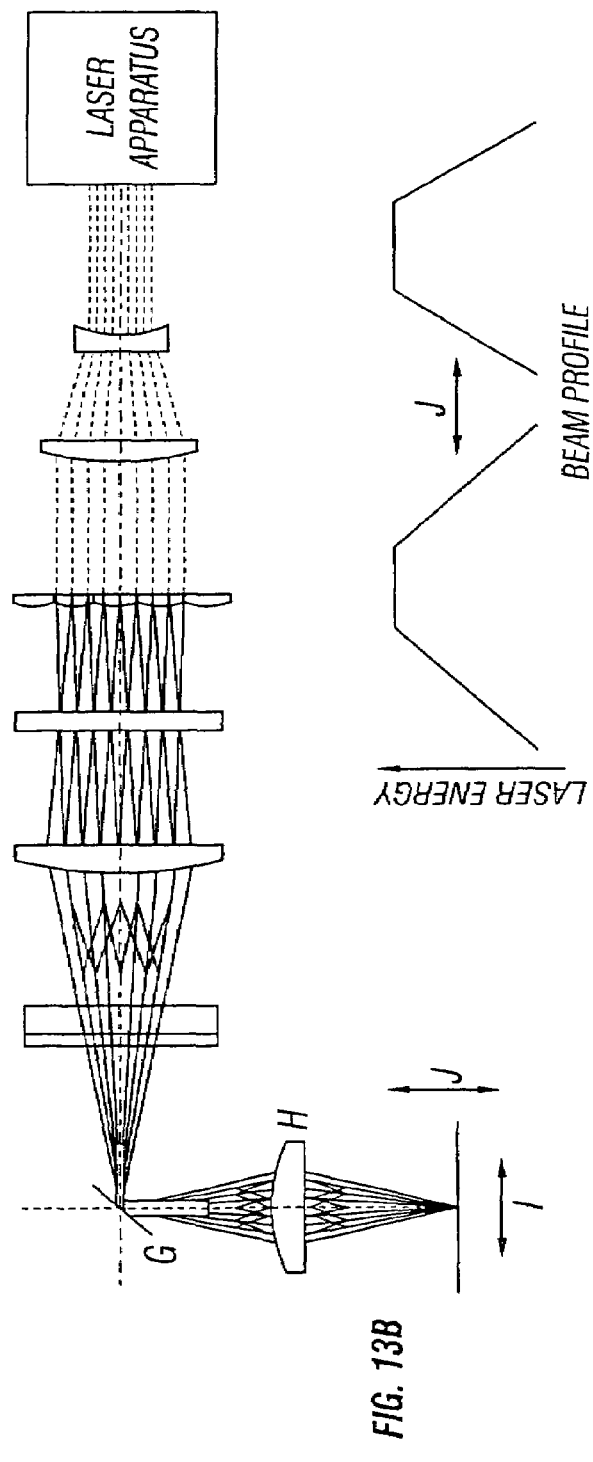
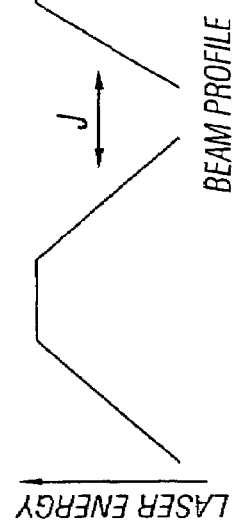
FIG. 13A
FIG. 13B
FIG. 13C

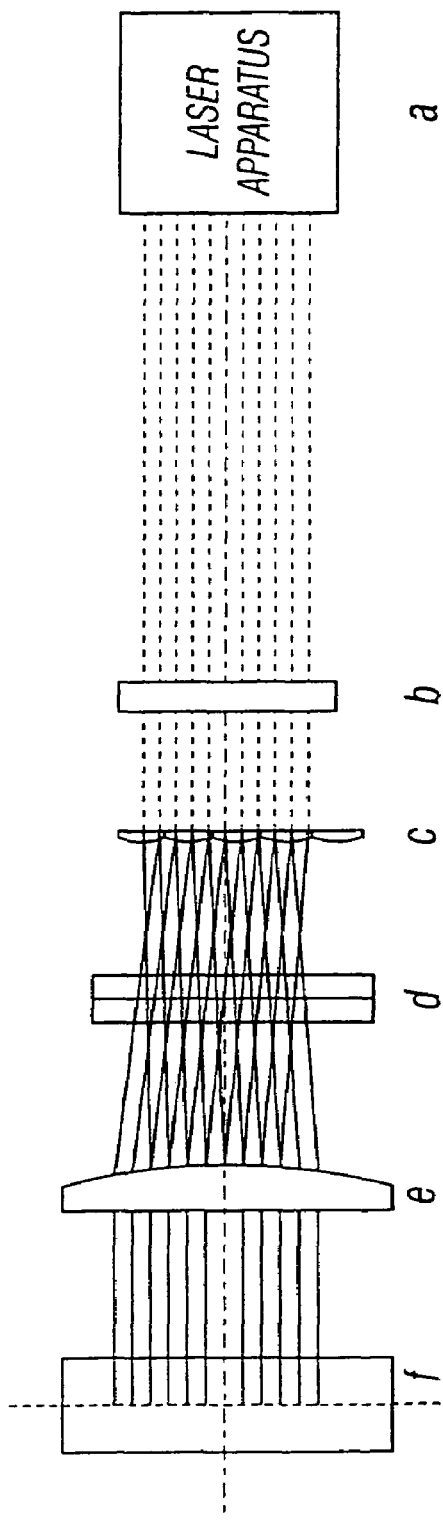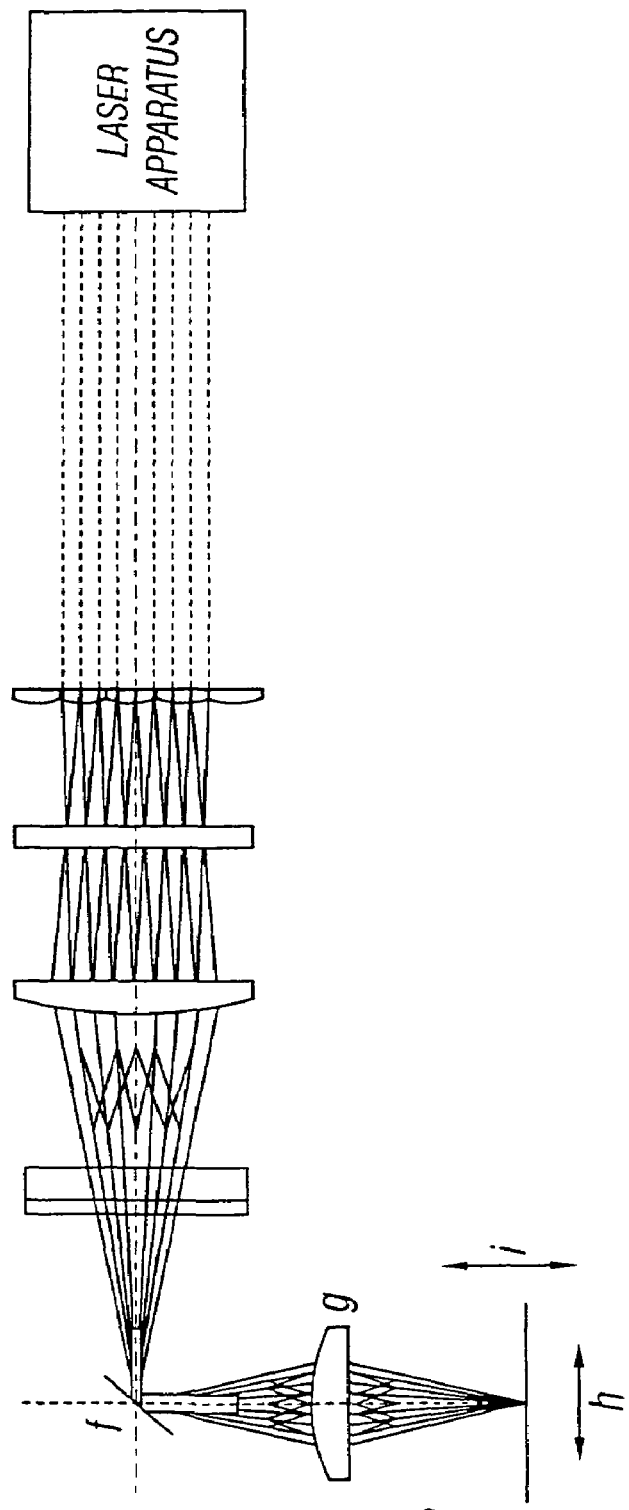
FIG. 14A
FIG. 14B

METHOD AND APPARATUS FOR PRODUCING SEMICONDUCTOR DEVICE

CROSS-REFERENCE TO RELATED APPLICATIONS

This application is a divisional application of U.S. application Ser. No. 09/304,523, filed May 4, 1999, now U.S. Pat. No. 6,902,616, which is a divisional of U.S. application Ser. No. 08/683,722, filed Jul. 18, 1996, now U.S. Pat. No. 5,907,770, which claims the benefit of foreign priority applications filed in Japan as Ser. No. 7-205379 on Jul. 19, 1995, as Ser. No. 7-215406 on Jul. 31, 1995, as Ser. No. 7-219533 on Aug. 4, 1995, and as Ser. No. 7-233306 on Aug. 18, 1995. This application claims priority to each of these prior applications, and the disclosures of the prior applications are considered part of (and are incorporated by reference in) the disclosure of this application.

BACKGROUND OF THE INVENTION

1. Field of the Invention

The present invention relates to a method and an apparatus for producing a semiconductor device which is capable of obtaining a crystalline silicon film high in uniformity by improving the flatness of a glass substrate during producing an insulated gate semiconductor device such as a thin film transistor (TFT) formed using a non-single crystal silicon film which is formed on the substrate, or other semiconductor devices. In particularly, the present invention is useful in producing a semiconductor device formed on the glass substrate.

2. Description of the Related Art

In recent years, several researches have been made into insulated gate field effect transistors having a thin film-shaped active layer (so-called active region) on an insulated substrate, which are so-called TFT).

Those TFTs are classified, for example, into an amorphous silicon TFT and a crystalline silicon TFT, depending upon the material or the crystal state of a semiconductor as used. The crystalline silicon stated here is directed to non-single crystal silicon which is not single crystal. Hence, those TFTs are generally called "non-single crystal silicon TFTs".

In general, the electric field mobility of a semiconductor which is in an amorphous state is small, and therefore not available to the TFTs that require a high speed operation. Also, the amorphous silicon cannot be used to produce a p-channel TFT (PMOS TFT) since the p-type electric field mobility of the amorphous silicon is remarkably small, and thus a complementary MOS circuit (CMOS) cannot be formed by the combination of the p-channel TFT and an n-channel TFT (NMOS TFT).

The crystalline semiconductor is larger in the electric field mobility than the amorphous semiconductor, and therefore enables a high speed operation. The crystalline silicon can be used for obtaining not only the NMOS TFT but also the PMOS TFT, thereby forming a CMOS circuit.

A crystalline silicon film is obtained by thermally cooling an amorphous silicon film obtained through the vapor phase growth technique at an appropriate temperature (600° C. or higher) for a long period of time, or by irradiating an intense light such as a laser beam (optically annealing).

However, in the event of using a glass substrate which is inexpensive and rich in processability as an insulating substrate, it is extremely difficult to obtain, by only annealing, a crystalline silicon film which is satisfactorily high in electric field mobility (high to the degree that the CMOS circuit can be formed).

This is because the above glass substrate is generally low in strain point (about 600° C.), and thus when the temperature of the substrate is elevated up to a temperature required for obtaining a crystalline silicon film sufficiently high in mobility, the substrate is warped.

In the event of applying the optically annealing technique for crystallizing a silicon film formed on the glass substrate, a high energy can be applied only to the silicon film without elevating the temperature of the substrate so much. Hence, the optically annealing technique is very effective in crystallizing the silicon film formed on the glass substrate.

It has been found that a high power pulse laser such as an excimer laser is the most suitable for the optimum light source for optically annealing. The maximum energy of the laser is extremely larger than that of the continuously oscillating laser such as an argon ion laser, and the mass productivity could be enhanced using a large spot which is several $cm^2$ or more in size.

However, because the beam as normally used is square or rectangular in shape, the beam is required to move vertically and horizontally for processing a single substrate having a large area. Thus, the optically annealing technique needed to be still improved from the viewpoint of the productivity.

The above matter could be remarkably improved with a technique in which the beam is deformed linearly, the width of the beam is a length that exceeds that of a substrate to be processed, and the substrate is scanned relatively by the beam (The scanning operation in the specification means that linear laser beams are irradiated onto the substrate while being overlapped one on another bit by bit.). The details are disclosed in Japanese Patent Unexamined Publication No. 5-112355.

The silicon film which is still high in crystallinity can be prepared by conducting the thermally annealing process prior to conducting the optically annealing process. In the thermally annealing process as described in Japanese Patent Unexamined Publication No. 6-244204, utilizing the effect that an element such as nickel, iron, cobalt, platinum, paradium (hereinafter referred to as "crystallized catalytic element, or simply "catalytic element") promotes the crystallization of amorphous silicon, the crystalline silicon film can be obtained by the thermally annealing process at a lower temperature for a shorter period of time in comparison with the normal case.

TFTs arranged in the form of a matrix are formed with a crystalline silicon film formed using the thermally annealing process and the optically annealing process together, and the distribution of their threshold voltage in the substrate surface is investigated.

FIG. 2 shows the distribution of the threshold values of the TFT using the crystalline silicon film formed through the conventional method, within the substrate surface. The distribution is U-shaped as shown in FIG. 2.

FIG. 4 shows the arrangement of TFTs on the glass substrate. The data in FIG. 2 is obtained, as shown in FIG. 4, in such a manner that the TFTs of 400×300 pieces are arranged in the form of a matrix in a region of 40×50 mm on a Corning 1737 substrate of 100 $mm^2$, and the respective locations of 400 TFTs disposed laterally in a line from one end to the other end (a portion surrounded by a dotted line in FIG. 4) are indicated correspondingly in the axis of abscissa.

When the pixel matrix that constitutes the pixel portion of a liquid crystal display has the distribution of threshold voltages shown in FIG. 2, the display state becomes nonuniform, resulting in a defective image.

As a result of researching the cause that the threshold voltage exhibits such a U-shaped distribution within the substrate surface by the applicant, it has been found that a tendency of the U-shaped distribution is very similar to the warp of the substrate immediately before a laser beam is irradiated onto the substrate.

Also, no warp of the substrate is found in the glass substrate immediately after an amorphous silicon film is formed on the glass substrate, and it has been found that the warp of the substrate is caused because, during a heat treatment (by which the film grows in the solid phase into a crystallized film) subsequent to the amorphous silicon film forming process, a silicon film (or silicon oxide film) is contracted higher than that of the glass substrate in cooling the substrate after the heat treatment. The warp of the substrate is produced in a U-shape viewed from the film formed on the substrate.

FIG. 3 shows a state in which a laser annealing is conducted on the silicon film formed on the substrate which has been warped. From FIG. 3, when the laser annealing is conducted on the silicon film in such a state where the substrate is warped, the focal point of the laser beam is shifted differently at the respective locations on the substrate.

It is presumed that the shift of the focal point makes the crystallinity of the silicon film different from each other within the substrate surface, so that the threshold voltage exhibits a specified distribution within the substrate surface.

The warp of the substrate immediately before a laser beam is irradiated onto the substrate having 100 mm square is different by about 50 μm between the central portion and the edge portion of the substrate. The degree of the warp fell within a range of about 20 to 200 μm although it depends upon the temperature of the above heat treatment process, a time necessary for processing, the material of the substrate, or the like. There is a case in which when the size of the substrate is about 500 mm square, its warp becomes about 1 to 2 mm.

SUMMARY OF THE INVENTION

The present invention has been made in view of the above circumstances, and therefore an object of the present invention is to enhance the flatness of a substrate after the heating process and the annealing process have been conducted on the substrate on which a film is formed.

Another object of the present invention is to provide a method of producing a crystalline silicon film formed on a glass substrate and having a uniform crystallinity within a substrate surface. Another object of the present invention is to provide a method of producing a plurality of crystalline silicon TFTs formed on a glass substrate and having a uniform threshold voltage within a substrate surface. Another object of the present invention is to provide a method of producing, in a process of crystallizing a silicon film on a glass substrate, in particular, having a thermally annealing process and a laser annealing process subsequent to the thermally annealing process, a crystalline silicon TFT having a uniform crystallinity within a substrate surface and also uniform threshold voltage within the substrate surface using the silicon film.

In order to solve the above problems, the present invention is achieved by a method of producing a semiconductor, including the steps of forming an amorphous silicon film on a glass substrate or on a silicon oxide film formed on the glass substrate, flattening the glass substrate at a temperature equal to or higher than a strain point of the glass substrate and equal to or lower than a softening point thereof, and conducting a laser annealing process on the silicon film.

Also, the present invention is achieved by a method of producing a semiconductor, including the steps of forming an amorphous silicon film on a glass substrate or on a silicon oxide film formed on the glass substrate, flattening the glass substrate at a temperature equal to or higher than a strain point of the glass substrate and equal to or lower than a softening point thereof and crystallizing the amorphous silicon film, and conducting a laser annealing process on the silicon film which has been crystallized through the above process.

The present invention is achieved by a method of producing a semiconductor device, including a step of forming a plurality of thin film transistors (TFTs) having the silicon film produced by the above semiconductor producing method as an active layer.

As described above, in the process of producing a TFT formed on the glass substrate, the glass substrate is warped and deformed after the step of thermally annealing the amorphous silicon film on the glass substrate.

Upon irradiating a laser beam onto the substrate thus deformed, the effect of irradiation of the laser beam is different at the respective locations of the substrate.

Therefore, a laser beam is irradiated onto the substrate after the substrate is processed into an extreme flat state prior to the laser irradiating step.

The present invention has been made by irradiating a laser beam onto the substrate after the substrate before being subjected to the laser irradiating step is subjected to a thermal treatment into an extreme flat state.

The glass substrate on which the amorphous silicon film has been formed is thermally annealed at a temperature equal to or higher than the strain point (593° C.) but equal to or lower than the softening point (844° C.) of the material of the glass substrate (for example, Corning 7059), for example, at 640° C. for about four hours. Thus, in the event of subjecting the substrate to the heat treatment in advance, the effective method is that the substrate is held at a temperature equal to or higher than the strain point of the glass as used and equal to or lower than the softening point thereof for several hours, and thereafter the substrate is cooled, from the viewpoint of the applicant's experiment. (It is difficult to flatten the substrate because it is so hard when the temperature is less than the strain point. The substrate is softened to the degree that the thickness of the substrate is changed when the temperature is higher than the softening point.)

The temperature within the temperature range, preferably a temperature close to an annealing point (639° C.) is most preferable in flattening the substrate.

In this case, the glass substrate is located on a base having a surface which has been flattened with high accuracy (preferably the roughness and waviness of the surface is 5 μm or less).

The glass substrate which is thermally annealed under the above condition is extremely lower in viscosity than that in the state of a room temperature, and the glass substrate is brought in close contact with the above base which is flattened with high accuracy by self-weight.

With cooling from the close contact state, the glass substrate is solidified while keeping that state. The glass substrate is flattened with high accuracy.

Also, the amorphous silicon film formed on the glass substrate is thermally annealed simultaneously in the above glass substrate flattening step so that the film grows in solid phase. Hence, the crystallization of the silicon film can be conducted simultaneously when the glass substrate is flattened.

As a result that the applicant investigated the influence of any steps for forming the TFT on the substrate on the shape of the substrate, the deformation of the substrate after the step of thermally annealing (including the cooling process) the amorphous silicon film has been completed is most remarkable, and no remarkable deformation has been found in the steps subsequent to the thermally annealing step. Hence, if the substrate is processed into a remarkable flat state immediately before the irradiation of a laser beam onto the substrate, the substrate after being subjected to all the steps can be kept in the flat state.

When a liquid crystal display is formed using the substrate, the glass substrate can be flattened extremely excellently, resulting in such an advantage that the cell pair can be made readily and surely.

In general, if the roughness and waviness of the surface of the substrate constituting the liquid crystal display is out of 5 µm or less, something interferes with the cell pair. Hence, it is extremely effective that the roughness and waviness of the flattened base with high accuracy to be used in the present invention, as well as the roughness and waviness of the surface of the substrate as formed are 5 µm or less.

Further, in order to solve the above problem, the present invention is characterized in that a base on which the glass substrate is mounted has a convex curved surface. In other words, the present invention has been achieved by a method of producing a semiconductor, characterized by crystallizing an amorphous silicon film formed on a flat glass substrate by heating, locating the glass substrate on a base having the convex curved surface, heating the glass substrate at a temperature close to the strain point of the glass substrate, and cooling the glass substrate.

Also, the present invention has been achieved by a method of producing a semiconductor, including the steps of crystallizing an amorphous silicon film formed on a flat glass substrate by heating, locating the glass substrate on a base having the convex curved surface, heating the glass substrate at a temperature close to the strain point of the glass substrate, cooling the glass substrate, and thereafter irradiating a laser beam onto the silicon film.

As described above, in the process of producing the TFT, etc., formed on the glass substrate, the glass substrate is warped and deformed after the step of thermally annealing the amorphous silicon film on the glass substrate.

Upon irradiation of a laser beam onto a substrate thus warped and deformed, the focal point of the laser beam is different at the respective locations of the substrate, with the result that the crystallinity becomes uniform within the substrate surface.

In view of the above, the glass substrate is made in a flat state after the thermally annealing step, and thus a laser beam is irradiated onto the substrate, thereby crystallizing the substrate uniformly within the substrate surface.

FIGS. 6A to 6C show a producing method in accordance with the present invention. A glass substrate 601 which is deformed in a convex shape is located on a base 602 (stage) having a convex curved surface which is substantially symmetric with the curved surface of the substrate 601 (deformed in the convex shape) which has been thermally annealed (thermally annealing and cooling) after a silicon film 600 is formed on the substrate 601. The substrate 601 is deformed by heating at a temperature close to the strain point of the glass substrate so that it is brought in close contact with the convex curved surface of the base 602 in FIG. 6B. Then, the substrate 601 is cooled. In cooling the substrate 601, a silicon film 600 contracts more markedly than that of the substrate 601, with the result that the substrate 601 changes from the convex curved surface state to the flat state as shown in FIG. 6C.

The present invention is achieved by a method of producing a semiconductor, including the steps of locating on a base having a convex curved surface a flat glass substrate on which an amorphous silicon film is formed, heating the glass substrate at a temperature close to the strain point of the glass substrate, thereafter cooling the glass substrate.

The present invention is achieved by a method of producing a semiconductor, including the steps of locating on a base having a convex curved surface a flat glass substrate on which an amorphous silicon film is formed, heating the glass substrate at a temperature close to the strain point of the glass substrate, cooling the glass substrate, and then irradiating a laser beam onto the silicon film.

FIGS. 7A to 7C show a producing method in accordance with the present invention. In crystallizing an amorphous silicon film 700 through the thermally annealing step, a glass substrate 701 is mounted on a convex curved surface type base 702 (stage) as shown in FIG. 7A, and the substrate is so heated as to be deformed into a convex curved surface type.

Then, the glass substrate 701 is deformed along the convex surface of the base 702 because of the lowering of the viscosity due to heating and the self-weight. Keeping this state, the substrate is heated, and then cooled after the completion of the heat treatment.

In this state, the silicon film 700 contracts more sharply than that of the glass substrate 701, and the glass substrate 701 returns from the convex curved surface type to the flat state (FIG. 7C).

In this way, the flattening of the glass substrate 701 and the crystallization of the semiconductor film 700 can be conducted simultaneously.

When the temperature necessary for the above glass substrate flattening process is within 70 to 115% of the strain point of the substrate, the effect of flattening the substrate is obtained.

When the heating temperature is lower than 70% of the strain point of the substrate, the substrate is not deformed at all, or a very long time is required for the deformation of the substrate. When the heating temperature is more markedly than 115% of the strain point of the substrate, the deformation of the substrate is remarkable, and thus the shape of the substrate is not fixed after cooling.

In the case where the glass substrate is flattened simultaneously when the amorphous silicon film is crystallized, it is more preferable that the temperature is higher in order to enhance the crystallinity. However, it has been recognized that the crystallinity is sufficiently improved even within the above temperature range. The temperature range is a value in a case of setting an absolute zero point as a reference.

FIG. 8 shows the producing method in accordance with the present invention. A glass substrate 801 on which a silicon film has been formed is located along a base 802 (stage) having a convex curved surface by pressing the edges of the substrate 801 by pushers 803, or the like, and the glass substrate 801 is deformed along the convex curved surface in a state before heating is conducted.

It is preferable that the stage 802 is made of quartz in order to prevent the substrate 801 from being tainted.

The glass substrate 801 is heated while maintaining this state, and the silicon film formed on the glass substrate 801 is subjected to the laser annealing process in this state.

The heating temperature at this time is the room temperature to 70% of the strain point of the glass substrate.

When the heating temperature exceeds 70% of the strain point of the glass substrate 801, the glass substrate 801 is liable to be thermally deformed, which makes it difficult to allow the substrate 801 to return to the flat surface after cooling. In the case where the heating temperature is an excessively low temperature, that is, lower than the room temperature, the crystallization becomes insufficient because heat is radiated.

Then, the substrate is cooled. In cooling the substrate, the silicon film contracts more sharply than that of the glass substrate 801, with the result that the glass substrate 801 returns from the convex curved surface type to the flat state.

FIG. 9 shows a substrate heating unit. When the substrate is heated in a system of FIG. 9, heating can be efficiently conducted on a substrate 901 having a curved surface. A base 903 having a heater 902 is located under the substrate 901, helium gas is heated by the heater 902, and the helium gas thus heated is circulated under the substrate 901 by a pump 904, thereby maintaining the substrate 901 to a desired temperature. The substrate 901 is fixed by pushers 905. The helium gas is used because the thermal conductivity is high.

In FIG. 10, a glass substrate 951 on which a silicon film has been formed is pushed on a base 952 (stage) having a convex U-shaped curved surface by pushers 953, thereby making the glass substrate 951 curve into a convex U-shaped curved surface.

The glass substrate 951 is heated while maintaining this state, and the silicon film formed on the glass substrate is annealed by a laser beam in this state.

The heating temperature at this time is the room temperature to 70% of the strain point of the glass substrate 951. A preferable heating method is shown in FIG. 9.

When the heating temperature exceeds 70% of the strain point of the glass substrate 951, the glass substrate 951 is liable to be thermally deformed, which makes it difficult to allow the substrate 951 to return to the flat surface after cooling. In the case where the heating temperature is an excessively low temperature, that is, lower than the room temperature, the crystallization becomes insufficient because heat is radiated.

A laser beam used for laser annealing is processed into a linear shape for the purpose of enhancing the efficiency of a laser processing.

FIG. 11 shows a laser irradiating method. In FIG. 11, the height of a base (stage) indicated by a dotted line fluctuates in accordance with the degree of a curvature of the substrate 960 in such a manner that the focal surface of a laser beam is always positioned on a surface to be processed.

Since the degree of the curvature of the substrate 960 is found by the shape of the base, the thickness of the substrate, etc., in advance, the height of the base is allowed to fluctuate on the basis of the data, whereby the focal surface of the linear laser beam may be kept constant regardless of the degree of curvature of the substrate. Also, an optical system is not changed as it is, and under the substantially same condition as in the case of using a flat substrate, the laser annealing can be conducted.

In order to irradiate the linear laser beam onto the curved surface which is curved into a U-shaped type as shown in FIG. 10, a laser beam is irradiated thereon as shown in FIG. 11, thereby being capable of conducting a uniform laser irradiation regardless of the substrate being curved, to thus obtain a high processing efficiency and a high uniformity of laser annealing as in the flat substrate.

This is a case where a linear laser beam is irradiated onto the U-shaped curved surface. Also, in the case of conducting a laser irradiation on the convex curved surface using a laser beam which is not linear but square, the laser anneal can be conducted likewise.

The focal point of the laser beam may fluctuate by not the height of the substrate but the adjustment of a lens. However, to make the focal point of the laser beam fluctuate, there is a case in which there is required such an optical design that the distribution of energy of the laser beam on the surface to be irradiated, the depth of focus thereof, etc., is not changed.

Then, the substrate is cooled. In cooling the substrate, the silicon film contracts more markedly than that of the glass substrate, with the result that the glass substrate returns from the convex curved surface type to the flat state, thereby obtaining a flat substrate having a crystalline silicon film.

As a result that the applicant investigated the influence of any step for forming the TFT on the substrate on the shape of the substrate, the deformation of the substrate before and after the step of the heat treatment for crystallizing the silicon film is most remarkable, and no remarkable deformation has been found in the steps subsequent to the heat treatment. Hence, if the substrate is processed into a remarkable flat state immediately before the irradiation of a laser beam onto the substrate, the substrate after being subjected to all the steps can be kept in a fairly flat state.

The producing method of the present invention provides a crystalline silicon film having an extremely uniform crystallinity within the substrate surface, and also provides a flat substrate.

In the present invention, the roughness and waviness of the glass substrate can be about 10 μm or less in a substrate 1.1 mm in thickness and 100 mm×100 mm in size. When the substrate is about 500 mm in size (for example, 370×400 mm$^2$, 400×500 mm$^2$, 550×650 mm$^2$ in size) and about 0.5 to 0.7 mm in thickness, the degree of the warp of the substrate after thermally crystallizing and cooling the amorphous silicon film may be 1 to 2 mm in difference in level. However, the present invention can manufacture the substantially flat substrate.

It should be noted that the convex curved surface and the U-shaped curved surface of the base on which the glass substrate is mounted is determined in accordance with the size, the thickness and the material of the glass substrate, the sort and the thickness of the film formed on the substrate, and other various conditions.

As the substrate is increased in area, the degree of curvature of the substrate is increased more. Also, it is curved two-dimensionally. Hence, in case of the glass substrate of about 100 mm×100 mm, the base on which the substrate is mounted may be of the shape having a U-shaped convex curved surface which is curved in only one direction. In this case, it is desirable that the convex curved surface of the inverse U-shape type of the base has 20 to 200 μm, preferably about 50 μm in a difference in level between the central portion of a region of the convex curved surface on which the glass substrate is mounted and the lowest portion of the edge of that region.

Also, When the size of the substrate is increased to the degree of 500 mm square, the glass substrate may be curved in two directions. Therefore, it is preferable to use the base having the convex curved surface such that the sections along the two directions become the inverse U-shape type. In the case of using a large-area glass substrate, it is desirable that a difference in level between the central portion of a region of the convex curved surface on which the glass substrate is mounted and the lowest portion of the edge of that region is about 1 to 2 mm.

As a result of forming a plurality of TFTs using a crystalline silicon film formed in accordance with the producing method of the present invention, the distribution of the threshold voltage of the TFTs can be made extremely uniform within the substrate surface. This effect is increased more as the substrate becomes large in area.

Also, the crystalline silicon TFTs for pixels and drive are disposed on the glass substrate in accordance with the present invention, and a liquid crystal display is formed using the substrate. In this case, because the glass substrate can be flattened extremely excellently in accordance with the producing method of the present invention, there is advantageous in that the cell pair can be made readily and surely. In this case, even when there is no crystallizing step due to the laser irradiation after the thermal crystallization, the effect of the invention to flatten the substrate is effective.

The present invention is characterized in that, in order to correct the warp of the glass substrate flatly, the glass substrate is sucked on a flat surface of a stage having the flat surface, the peripheral portion of the glass substrate is pressed (pressurized), or the like. Also, the present invention is characterized in that such a flattening and correcting means is added to the stage of the laser annealing unit.

According to the present invention, there is provided a laser annealing method including the steps of flattening a glass substrate on a stage and mounting the former on the latter, and irradiating a linear laser beam on the surface to be irradiated on the glass substrate in a scanning manner to conduct the laser annealing.

According to the present invention, there is provided a laser annealing method including the steps of crystallizing an amorphous silicon film formed on a glass substrate by heating into a crystalline silicon film, flattening the glass substrate on the stage and mounting the former on the latter, and irradiating a linear laser beam on the crystalline silicon film in a scanning manner to conduct the laser annealing.

According to the present invention, there is provided a laser annealing method including the steps of crystallizing an amorphous silicon film formed on a glass substrate by heating into a crystalline silicon film, mounting the glass substrate on a stage having a flat surface in such a manner that the lower surface of the glass substrate is in close contact with the flat surface of the stage, and irradiating a linear laser beam on the crystalline silicon film in a scanning manner to conduct the laser annealing.

According to the present invention, there is provided a laser annealing method including the steps of crystallizing an amorphous silicon film formed on a glass substrate by heating into a crystalline silicon film, mounting the glass substrate on a stage having a flat surface in such a manner that the lower surface of the glass substrate is sucked with the flat surface of the stage under vapor, and irradiating a linear laser beam on the crystalline silicon film in a scanning manner to conduct the laser annealing.

According to the present invention, there is provided a laser annealing method including the steps of crystallizing an amorphous silicon film formed on a glass substrate by heating into a crystalline silicon film, mounting the glass substrate on a stage having a flat surface in such a manner that the lower surface of the glass substrate is in close contact with the flat surface of the stage by pressing the peripheral portion of the upper surface of the glass substrate, and irradiating a linear laser beam on the crystalline silicon film in a scanning manner to conduct the laser annealing.

According to the present invention, there is provided a laser annealing device including a stage having means for flattening and mounting a glass substrate, and means for irradiating a linear laser beam onto a surface to be irradiated of the glass substrate in a scanning manner.

According to the present invention, there is provided a laser annealing device including a stage having a flat surface on which a glass substrate is mounted and means for contacting the lower surface of the glass substrate with the flat surface thereof, and means for irradiating a linear laser beam onto a surface to be irradiated of the glass substrate in a scanning manner.

According to the present invention, there is provided a laser annealing device including a stage having means for flattening and mounting a glass substrate having thereon a crystalline silicon film which has been crystallized by heating, and means for irradiating a linear laser beam on a crystalline silicon film on the glass substrate in a scanning manner.

According to the present invention, there is provided a laser annealing device including a stage having a flat surface on which a glass substrate having a crystalline silicon film crystallized by heating is mounted and means for contacting the lower surface of the glass substrate with the flat surface thereof, and means for irradiating a linear laser beam onto the crystalline silicon film in a scanning manner.

According to the present invention, there is provided a laser annealing device including a stage having a flat surface on which a glass substrate having a crystalline silicon film crystallized thereon by heating is mounted and means for making the lower surface of the glass substrate suck on the flat surface thereof under vapor, and means for irradiating a linear laser beam onto the crystalline silicon film in a scanning manner.

According to the present invention, there is provided a laser annealing device including a stage having a flat surface on which a glass substrate having a crystalline silicon film crystallized thereon by heating is mounted and means for pressing the peripheral portion of the upper surface of the glass substrate, and means for irradiating a linear laser beam onto the crystalline silicon film in a scanning manner.

According to the present invention, in the above structure, the crystalline silicon film may be a film a part of which contains an impurity by ion doping or the like.

Also, according to the present invention, in the above structure, a pulse laser, more preferably an excimer laser may be used as a light source of the linear laser beam.

The present invention is that when the crystalline silicon film obtained by thermally crystallizing the amorphous silicon film formed on the glass substrate, patterned, machined and shaped crystalline silicon film, or those crystalline silicon film being added with an impurity is subjected to a laser annealing by scanning the linear laser beam, the warp of the glass substrate caused by the thermally annealing step is annealed on the stage on which the glass substrate is mounted by a laser beam in a forcedly flattened state.

In the present invention, the flattening of the glass substrate is to correct the glass substrate in such a manner that some external force is applied to the glass substrate to reduce the warp of the substrate in the state where the glass substrate is located on the stage.

The flattening of the glass substrate is conducted to the degree that the crystalline silicon film on the glass substrate is formed can be uniformly annealed using a linear laser beam.

A difference in level within the surface of the crystalline silicon film on the glass substrate may be reduced so that the crystallinity of the crystalline silicon film falls within a range which unifies into a required level after the laser annealing.

In the present invention, with the glass substrate being mounted flatly, the linear laser beam is irradiated uniformly onto the crystalline silicon film which is a surface to be irradiated without any displacement of the focal point regardless of the glass substrate per se being curved.

As a result, the crystalline silicon film having the uniform crystallinity and mobility with the same quality within the substrate surface can be obtained.

According to the present invention, the crystalline silicon film on the glass substrate which has been warped after the thermally crystallization has been conducted is corrected to the degree that the warp of the glass substrate can be ignored, thereby irradiating a linear laser beam thereon.

Therefore, the focal point of the linear laser beam on the surface to be irradiated can be prevented from shifting. As a result, even though the laser annealing is conducted on the substrate by scanning the linear laser beam, the uniform crystallization can be conducted, and the threshold voltage of the TFT on which the film is formed can be unified within the substrate surface.

Because the degree of warp is more remarkable as the glass substrate is increased in size, the effect of the present invention becomes more remarkable as the glass substrate is increased in size.

BRIEF DESCRIPTION OF THE DRAWINGS

FIGS. 13A to 13C show an optical system;

FIGS. 14A and 14B show an optical system;

DETAILED DESCRIPTION OF THE PREFERRED EMBODIMENTS

First Embodiment

FIGS. 1A to 1F show a process of producing a thin film transistor (TFT) in accordance with a first embodiment.

An under silicon oxide film 102 having a thickness of 2000 Å is formed on a glass substrate (in this embodiment, using a Corning 7059 of 100 mm square), and an amorphous silicon film 103 having a thickness of 500 Å is formed sequentially on the under silicon oxide film 102 by plasma CVD.

Then, in order to add nickel as a catalytic element that promotes crystallization, nickel acetate aqueous solution of 10 ppm is coated on the surface of silicon, and nickel acetate layer not shown is formed through the spin coating technique.

Figure 1A:
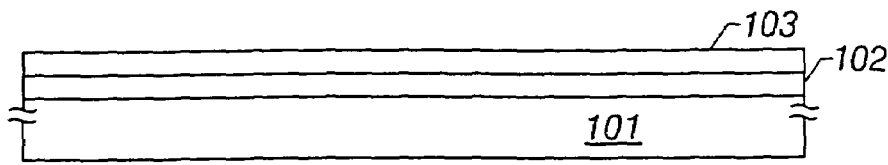
FIGS. 1A to 1F show a producing process in accordance with an embodiment of the present invention.

It is more preferable that a surface active agent is added to the nickel acetate aqueous solution. Since the nickel acetate layer is very thin, although it is not limited to a film shape, it does not suffer from a problem in the subsequent process (FIG. 1A).

Then, the glass substrate 101 is located on a stage having a surface flattened with high accuracy (the roughness and waviness of the surface is 5 μm or less), and then thermally annealed at 640° C. for four hours, to flatten glass substrate 101 and crystallize the amorphous silicon film. In this state, nickel serves as the core of crystal, to promote the crystallization of the amorphous silicon film.

The strain point of the Corning 7059 substrate is 593° C., and the softening point is 844° C., and the annealing temperature of 640° C. is between the strain point and the softening point. Also, the annealing point of the Corning 7059 is 639° C.

In thermally crystallizing the substrate, that the processing can be made at a low temperature for a short period of time, that is, at 640° C. for four hours is caused by the function of nickel. The details are disclosed in Japanese Patent Unexamined Publication No. 6-244104.

The above publication discloses that the thermal annealing, for example, at 550° C. (below the strain point) for four hours is conducted so that the temperature in thermally annealing does not exceed the strain point of the glass substrate. However, the temperature is determined so that the glass substrate is deformed as little as possible in thermally crystallizing.

The present invention is to raise the substrate temperature up to a temperature at which the glass substrate is liable to be deformed as much as possible reversely so that the crystallization as well as the flattening of the substrate is conducted simultaneously.

It is preferable that the concentration of a catalytic element is $1 \times 10^{15}$ to $1 \times 10^{19}$ atoms/cm$^3$. When it is a high concentration equal to or more than $1 \times 10^{19}$ atoms/cm$^3$, a metallic nature is exhibited on silicon so that the semiconductor characteristic disappears. The concentration of the catalytic element in the silicon film in this embodiment is $1 \times 10^{17}$ to $5 \times 10^{18}$ atoms/cm$^3$ at the minimum in the film. Those values are the minimum values of the concentration of the catalytic elements in the silicon film which has been analyzed and measured by the secondary ion mass spectrometry (SIMS).

In this way, the crystallization of the silicon film and the flattening of the substrate are conducted, and after the completion of the process, the substrate is cooled up to the room temperature at 2° C./min.

In the case where the catalytic element that promotes crystallization is not added to the silicon film, if the heating temperature is low, then there is a case in which only the flattening of the substrate is conducted in the above process, and no crystallization is conducted. However, that the uniform crystallization can be conducted in the subsequent laser annealing process is identical with the case in which the catalytic elements are added to the silicon film.

In order to further enhance the crystallinity of the crystalline silicon film, an excimer laser beam which is a high-power pulse laser is irradiated onto the film.

In this embodiment, a KrF excimer laser (248 nm in wavelength and 30 nsec in pulse width) is processed into a linear shape before being used. The size of a laser beam is 1×125 mm$^2$. The irradiation of the laser beam is conducted with the energy density of the laser beam being within 100 mJ/cm$^2$ to 500 mJ/cm$^2$, for example, 370 mJ/cm$^2$.

The crystallinity is further enhanced by irradiating a laser beam onto the film with an energy of about 220 mJ/cm$^2$ in advance before the above irradiation of the laser beam.

Figure 1B:
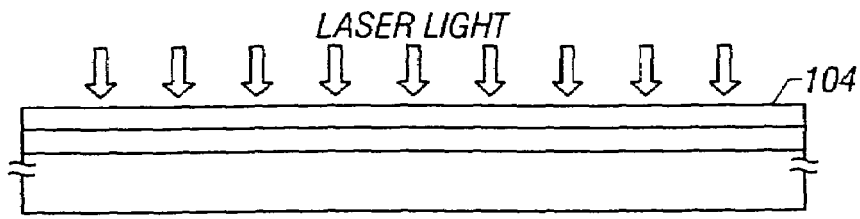

The laser irradiating method is as follows. The linear laser beam is irradiated onto the film while being shifted relatively with respect to an object to be irradiated. A direction in which the linear laser beam is shifted is substantially perpendicular to the line direction. In this situation, paying an attention to one point of a surface to be irradiated, the laser beams of 2 to 20 shots are irradiated onto the point. Also, the substrate temperature at the time of irradiating the laser beam is 200° C. (FIG. 1B).

A TFT is fabricated on the crystalline silicon film 104. The TFT is disposed on the substrate in the form of a matrix. Specifically, TFTs of 400×300 pieces are fabricated in a fabrication area of 40×50 mm$^2$. This process will be described below.

Figure 1C:
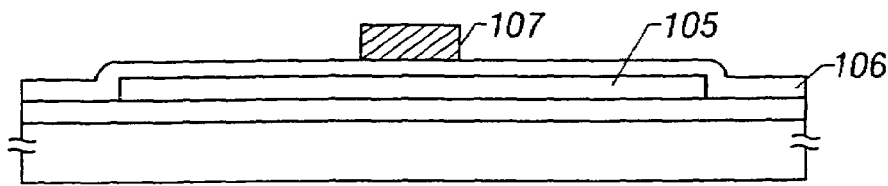

A silicon film is so etched as to form an island silicon region 105. Then, a silicon oxide film 106 having a thickness of 1200 Å is formed as a gate insulating film by plasma CVD. The raw material gas of the plasma CVD as used is TEOS and oxygen. The substrate temperature when forming the film on the substrate is 250 to 380° C., for example, 300° C. (FIG. 1C).

Sequentially, an aluminum film (containing silicon of 0.1 to 2% therein) having a thickness of from 3000 to 8000 Å, for example, 600 Å is deposited by sputtering. Then, the aluminum film is so etched as to form a gate electrode 107 (FIG. 1C).

Then, an impurity (boron) is implanted into a silicon region with a mask of the gate electrode 109 by ion doping. The doping gas as used is diborane ($B_2H_6$) which has been diluted with hydrogen into 1 to 10%, for example, 5%.

Figure 1D:
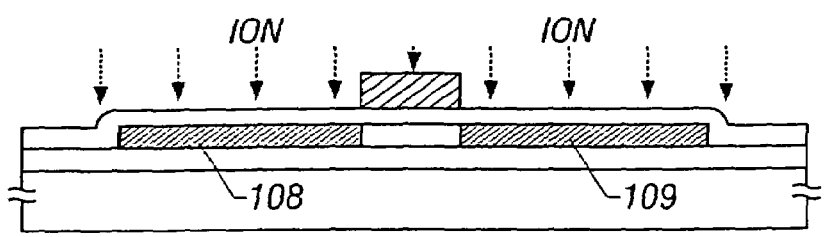

An accelerating voltage is 60 to 90 kV, for example, 65 kV, the dose amount is $2\times10^{15}$ to $5\times10^{15}$ atoms/cm$^2$, for example, $3\times10^{15}$ atoms/cm$^2$. The substrate temperature at the time of ion doping is the room temperature. As a result, p-type impurity regions 108 (source) and 109 (drain) are formed (FIG. 1D).

Then, in order to activate doped boron, annealing is optically conducted again using the KrF excimer laser. The energy density of the laser beam is 100 to 350 mJ/cm$^2$, for example, 250 mJ/cm$^2$. The crystallinity is further enhanced by irradiating a laser beam onto the film with an energy of about 170 mJ/cm$^2$ in advance before the irradiation of the laser beam.

Figure 1E:
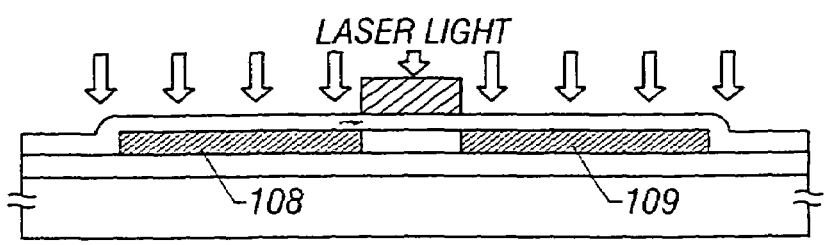

The laser irradiating method is as follows. The linear laser beam is irradiated onto the film while being shifted relatively with respect to an object to be irradiated. A direction in which the linear laser beam is shifted is substantially perpendicular to the line direction. In this situation, paying an attention to one point of a surface to be irradiated, the laser beams of 2 to 20 shots are irradiated onto the point. Also, the substrate temperature at the time of irradiating the laser beam is 200° C. Thereafter, annealing is thermally conducted in the nitrogen atmosphere at 450° C. for 2 hours (FIG. 1E).

Figure 1F:
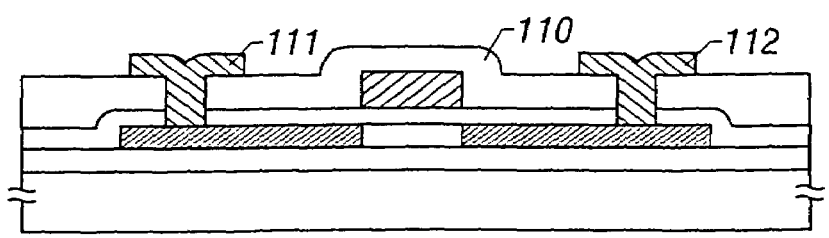

A silicon oxide film 110 having a thickness of 6000 Å is formed as an interlayer insulator by plasma CVD, in which contact holes are defined. Then, electrodes-wirings 111 and 112 of the source and the drain of the TFT are formed of a multi-layer film made of a metal material, for example, titanium and aluminum. Finally, annealing is thermally conducted at 200 to 350° C. under the hydrogen atmosphere of 1 atmospheric pressure (FIG. 1F).

Figure 5:
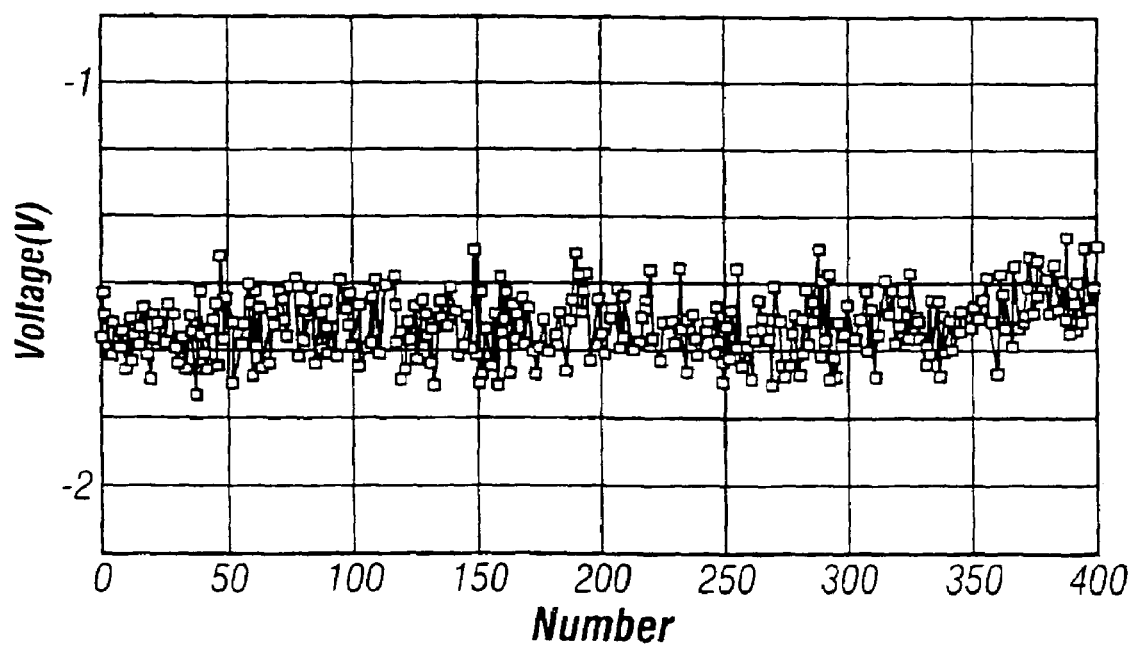
FIG. 5 shows the distribution of the threshold voltage of a TFT using a crystalline silicon film formed in accordance with the embodiment within a substrate surface.

FIG. 5 shows the distribution of the threshold values of the TFT using a crystalline silicon film formed in accordance with this embodiment within the substrate surface.

Figure 2:
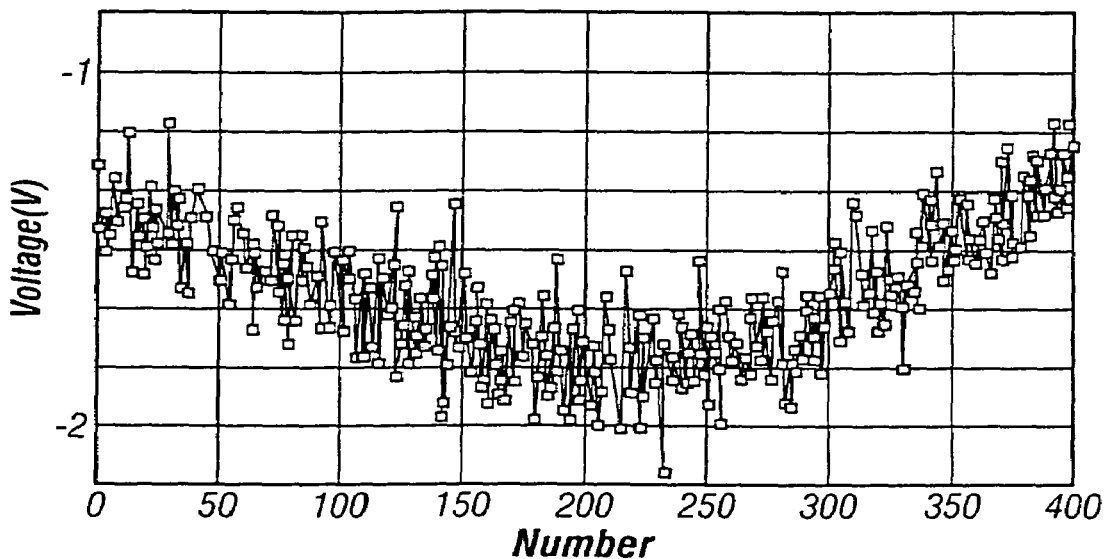
FIG. 2 shows the distribution of the threshold voltage of a TFT using a crystalline silicon film formed in accordance with a conventional method within a substrate surface.
Figure 3:
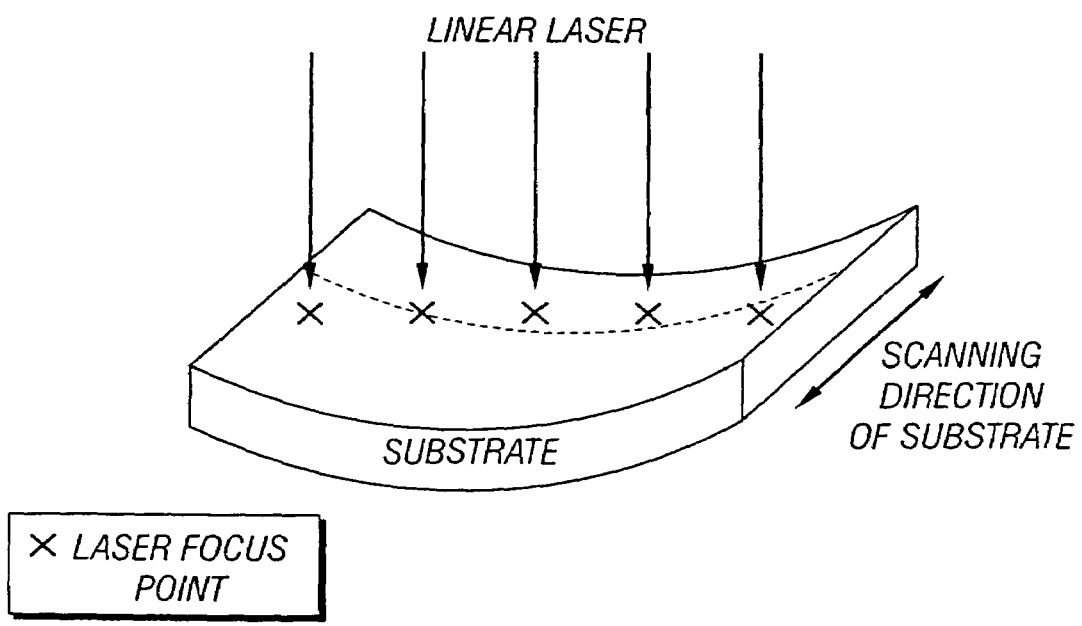
FIG. 3 shows a state in which a silicon film formed on the glass substrate which has been warped is annealed by a laser beam.
Figure 4:
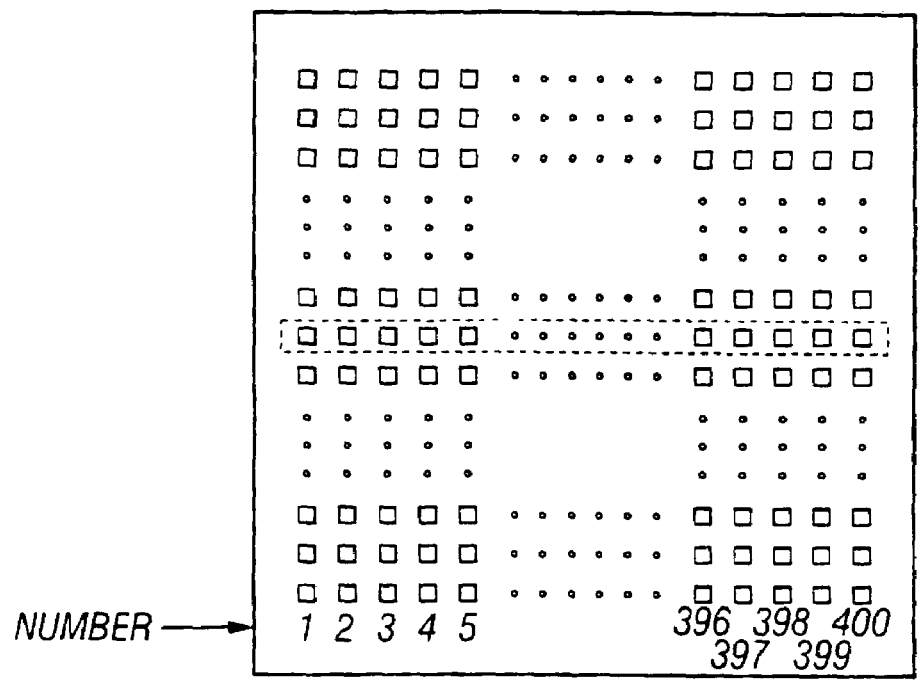
FIG. 4 shows a TFT formed on the glass substrate.

The axis of abscissa in FIG. 5 corresponds to the respective locations of the TFT shown in FIG. 4 (a portion surrounded by a dotted line in FIG. 4) as in the case of FIG. 2.

In FIG. 5, the TFT fabricated by this embodiment has a uniform threshold value within the substrate surface. It is apparent that the TFT in FIG. 5 has, within the substrate surface, a uniform threshold voltage more than the conventional example shown in FIG. 2.

Second Embodiment

A second embodiment will be described with reference to FIGS. 1A to 1F. An under silicon oxide film 102 having a thickness of 2000 Å is formed on a glass substrate 101 (In this embodiment, there is used a Corning 1737 of 400×500 mm square and 0.7 mm thickness. Another glass substrate such as Corning 7059, OA2, NA45, etc., may be used.), and an amorphous silicon film 103 having a thickness of 500 Å is formed sequentially on the under silicon oxide film 102 by plasma CVD.

Then, nickel acetate aqueous solution of 10 ppm is coated on the surface of silicon, and a nickel acetate layer not shown is formed by spin coating.

It is more preferable that a surface active agent is added to the nickel acetate aqueous solution. Since the nickel acetate layer is very thin, although it is not necessarily to be in a film shape, it does not suffer from any problem in the subsequent process (FIG. 1A).

Then, the glass substrate 101 is thermally annealed at 550° C. for four hours, to crystallize the amorphous silicon film 103. In this state, nickel serves as the core of crystal, to promote the crystallization of the amorphous silicon film. The strain point of the Corning 1737 substrate is 667° C., and the annealing temperature of 550° C. is under the strain point.

After the thermal crystallization, when the glass substrate is cooled, the silicon film contracts so that the substrate produces the concave warp.

That the processing can be made at a low temperature (the strain point of the Corning 1737 or less) for a short period of time, that is, at 550° C. for four hours is caused by the function of nickel. The details are disclosed in Japanese Patent Unexamined Publication No. 6-244104. The publication discloses that the thermal annealing, for example, at 550° C. (below the strain point) for four hours is conducted so that the temperature in thermally annealing does not exceed the strain point of the glass substrate. However, the temperature is determined so that the glass substrate 101 is prevented from being remarkably deformed in thermally crystallizing.

Figure 6A:
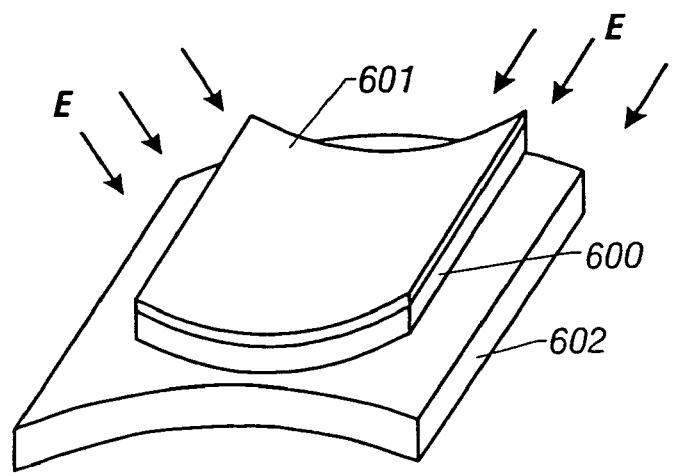
FIGS. 6A to 6C show the producing method of the embodiment.

In order to correct the warp of the glass substrate 101 after the above thermally crystallizing process, the glass substrate 601 is put on a base 602 having a convex curved surface as shown in FIG. 6A, and then appropriately heated (at 350 to 600° C. for several hours). The convex curved surface has a curved surface which is substantially symmetric with the warp of the glass substrate.

Figure 6B:
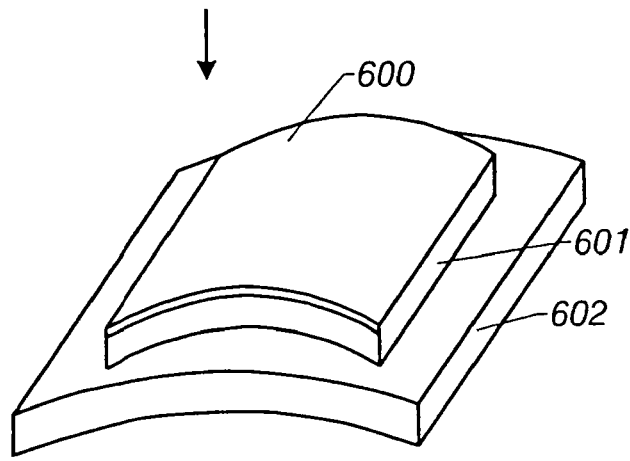

Then, in FIG. 6B, the glass substrate 601 is deformed along the shape of the base 602 by self-weight and heat. In this state, when the glass substrate is cooled, the silicon film 600 formed on the substrate contracts more markedly than the glass substrate 601, with the result that an extremely flat glass substrate 601 can be obtained.

In order to further enhance the crystallinity of the crystalline silicon film thus obtained, an excimer laser beam which is a high-power pulse laser is irradiated onto the film.

The outline of the laser annealing unit will be described below.

Figure 12:
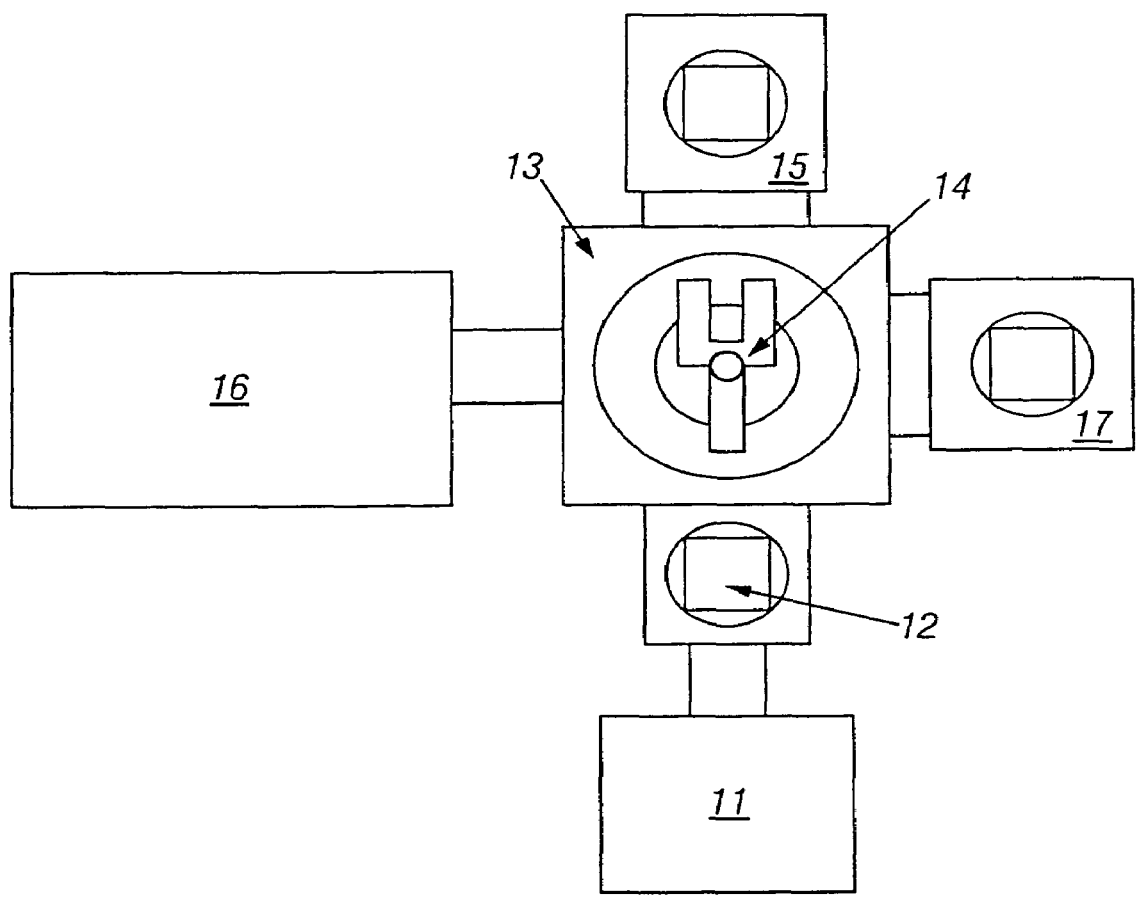
FIG. 12 is a conceptual diagram showing a laser annealing unit used in the embodiment.

FIG. 12 shows a conceptual diagram of a laser annealing unit used in this embodiment of the present invention. The laser annealing unit shown in FIG. 12 is of the multi-chamber system which is designed in such a manner that a substrate taken in from a loader/unloader chamber 11 and positioned at an alignment chamber 12 is transferred to the respective chambers 13 through a transfer chamber 13 by a substrate transfer robot 14 disposed in the transfer chamber 13 so that each substrate is sequentially processed.

The substrate is firstly taken in the thermal chamber 15, and after being subjected to the heat treatment such as the preliminary heating, a laser annealing is conducted in the laser annealing chamber. Then, after the substrate is conveyed to the cooling chamber 17 and cooled, it is moved to the loader/unloader chamber 11, and moved outward.

The dispersion of the energy for each pulse of the laser annealing unit is 3σ within ±3%.

A pulse laser larger in dispersion than the above laser may be used, but the focal depth is narrowed the dispersion of 3σ exceeding ±10% is not applicable to the present invention.

An oscillator as used is EX748 made by LUMNICS Corporation. The laser beam as oscillated is a KrF excimer laser beam (248 nm in wavelength and 25 ns in pulse width).

Another excimer laser as well as another type laser can be used. It should be noted that a laser beam of a pulse oscillator need to be used.

The laser annealing unit has a sealing property against the surroundings so as to prevent the contamination due to an impurity. Also, it has an atmosphere control function when irradiating a laser beam. Also, the laser annealing unit has a function for heating the substrate so that an object to be irradiated when irradiating a laser beam can be kept to a desired temperature.

The oscillated laser beam is introduced into an optical system as shown in FIGS. 13A and 13B because the shape of the laser beam is deformed.

The laser beam immediately before being shone onto the optical system is of the rectangular of about 3×2 cm$^2$, however the laser beam is processed into a slender beam (linear beam) of about 10 to 30 cm in length and 0.01 to 0.3 cm in width, depending on the optical system.

Figure 15A:
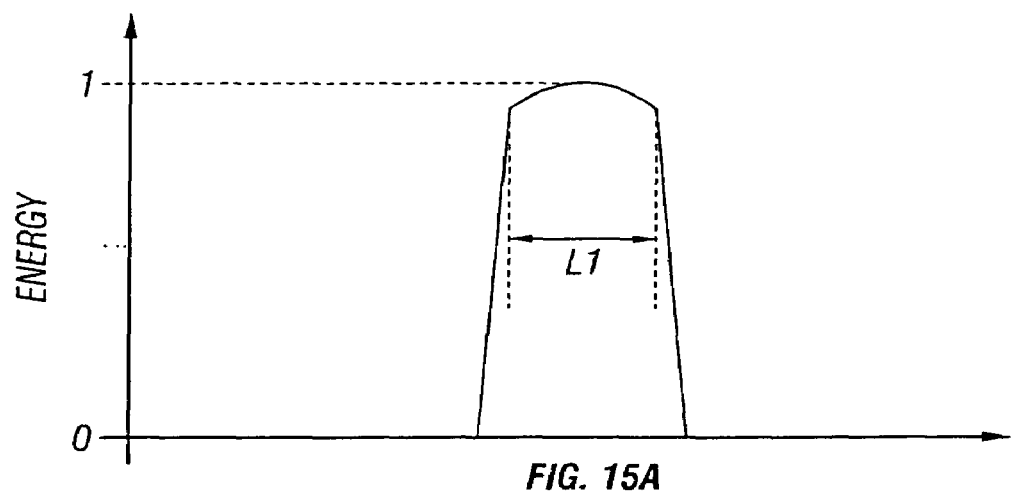
FIGS. 15A and 15B show the distribution of energy of a laser beam.
Figure 15B:
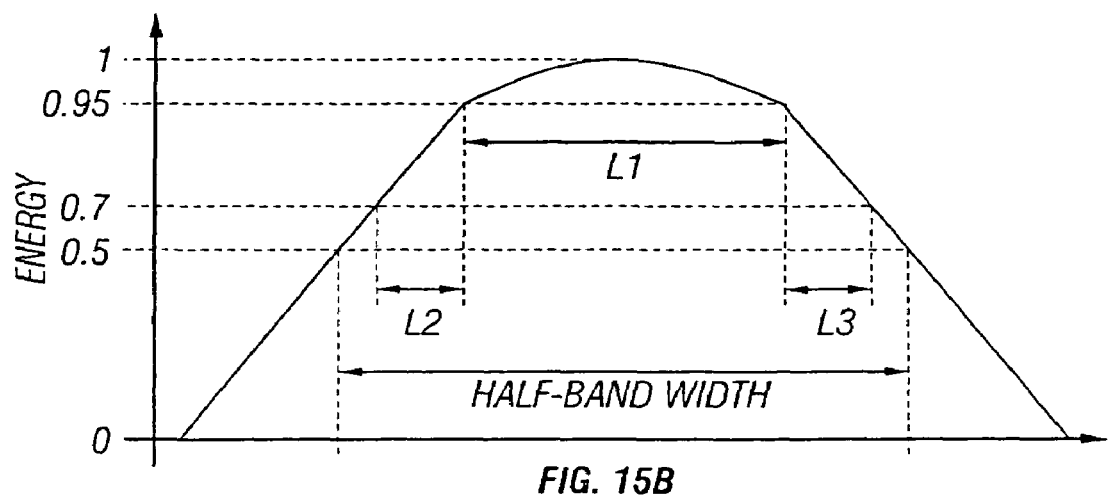

Also, the distribution of the energy density of the linear laser beam that has passed through the optical system in the cross direction is trapezoidal as shown in FIG. 15B. The energy of the laser beam that has passed through the optical system is 800 mJ/shot at the maximum.

The reason why the laser beam is processed into such a slender beam is to improve the processability. When the linear beam is irradiated onto a sample, if the length of the laser beam is longer than the width of the sample, then the sample is moved in one direction, thereby irradiating a laser beam onto the entire sample.

Even though the length of the beam is shorter than the width of the sample, troublesomeness in processing is saved in comparison with the rectangular beam. However, in this case, there occurs the necessity of moving the beam vertically and horizontally relatively with respect to the sample.

The stage (base) for the substrate (sample) on which a laser beam is irradiated is controlled by a computer and so designed as to be moved perpendicularly to the line direction of the linear laser beam. Also, it is so designed that the height of the substrate can fluctuate.

If the stage is provided with a function for moving in the line direction of the laser beam, even though the beam width is shorter than the sample, a laser processing on the entire sample is enabled.

The optical path in the interior of the optical system that processes a laser beam into a linear laser beam will be described.

The laser beam incident to the optical system passes through a cylindrical concave lens B, a cylindrical convex lens C (the lenses B and C are generally called "beam expander"), and fly eye lenses D and D2.

The laser beam passes through a cylindrical convex lens E as a first cylindrical lens, and a cylindrical convex lens F as a second cylindrical lens provided for improving the uniformity of the linear beam in the line direction, and is then converged by the cylindrical convex lens H via a mirror G before being irradiated onto the surface to be irradiated.

A distance between the cylindrical lenses A and B is 230 mm, a distance between the fly eye lenses D and D2 is 230 mm, a distance between the fly eye lens D and the cylindrical lens E is 650 mm, and a distance between the cylindrical lens F and the surface to be irradiated is 650 mm (the sum of the focal distances of the respective lenses). It is needless to say that these distances can be changed in accordance with the circumstances. The cylindrical lens H as used has a focal distance of 120 mm.

The shape of the energy distribution of the focal points of the laser beam is made trapezoidal by changing the lens H vertically (J-direction).

The surface to be irradiated is moved vertically (J-direction) relatively with respect to the lens H, thereby being capable of deforming the shape of the energy distribution of the laser beam on the surface to be irradiated (focal point) with a range of from a nearly square shape to a nearly trapezoidal shape (refer to FIG. 13C). In order to more sharpen those shapes, a slit may be inserted in the laser optical path.

The optical system is not particularly limited if it is so designed as to deform the laser beam to the shape required by the present invention.

The laser beam is shaped into a linear form, and the area of a laser beam on the surface to be irradiated is 125 mm×1 mm. The width of the linear laser beam is half width of the maximum energy value of the laser beam.

The energy profile (energy distribution) of the linear laser beam in the cross direction has an artificial trapezoidal distribution of L1=0.4 mm and L2, L3=0.25 mm as shown in FIG. 15B, which satisfies the inequality of $0.5L1 \leq L2 \leq L1$, $0.5L \leq L3 \leq L1$. In this case, the focal depth can be about ±400 μm.

The degree of widening of the bottom of the trapezoidal distribution is changed in accordance with a distance between the final lens of the laser optical system and the surface to be irradiated. A distance between the final lens of the laser optical system and the surface to be irradiated is changed by the roughness of the object to be irradiated during the laser processing.

With any change of the distance between the final lens and the surface to be irradiated, the degree of widening of the bottom of the trapezoidal distribution of the laser beam is changed. If a range of the change is within a range of the above inequality, then the focal depth of about ±400 μm is obtained, and therefore when the roughness of the surface to be irradiated is ±400 μm or less, the uniform laser processing is enabled.

On the contrary, the general laser beam having a square energy distribution is about ±200 μm or less in focal depth, and is adversely affected by the roughness of the surface to be irradiated and a difference in level, thereby being liable to make the crystallinity within the substrate surface nonuniform.

The sample is put on the stage (base) within the laser annealing chamber 16 shown in FIG. 12, and a laser beam is irradiated while the stage is moving at 2 mm/s. The laser irradiation conditions are that the energy density of the laser beam is 100 to 500 mJ/cm$^2$, in this example, 300 mJ/cm$^2$, and the number of pulses is 30 pulses/s. The energy density means the density of the upper bottom portion (a portion having a maximum value) of the trapezoidal laser beam. The substrate temperature when irradiating the laser beam is 200° C.

The irradiation of the laser beam is conducted under the above conditions. Paying an attention to a certain point of the sample, the laser beams are irradiated at 15 steps. This is because, since it takes 0.5 sec to allow one laser beam to pass, 15 pulses are irradiated on one location by irradiating the laser beam in the scanning manner. In this example, in the above 15 irradiations, the initial several irradiations have the irradiated energy density gradually increased, and the final several irradiations have the irradiated energy density gradually decreased.

Figure 16:
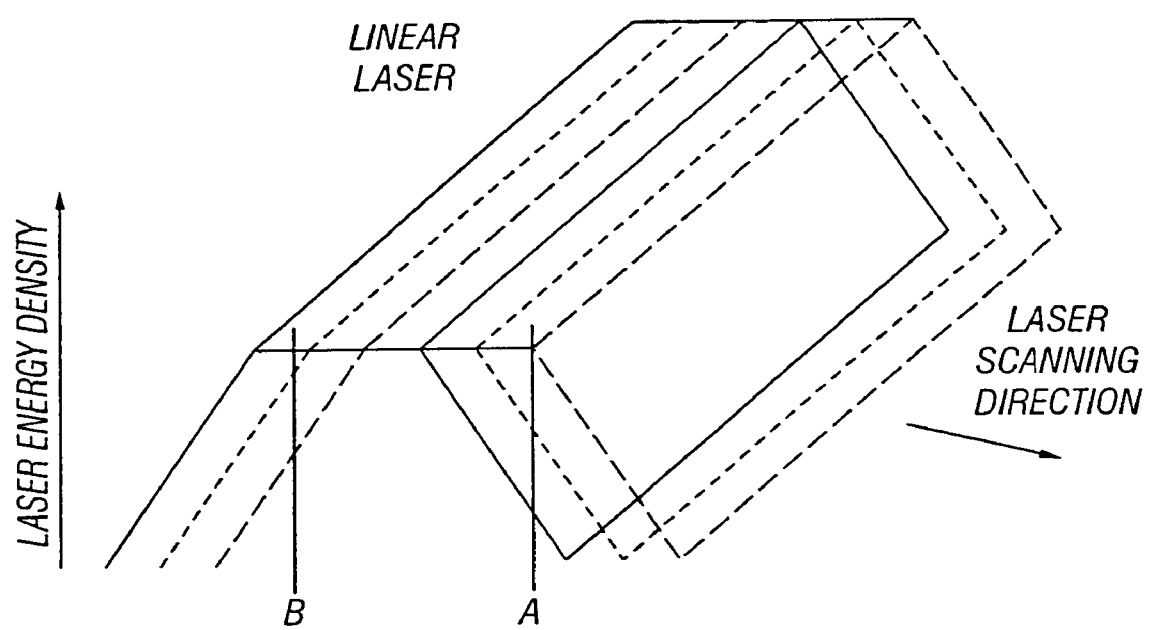
FIG. 16 show the distribution of the energy density of a laser beam processed into a linear shape in the widthwise direction of the laser beam.

This state is schematically shown in FIG. 16. In the first half of 15 steps, the laser energy gradually increases (see A in FIG. 16) whereas, in the latter half thereof, it gradually decreases (see B in FIG. 16).

With such an irradiation of the laser beam, the use of a single pulse laser beam can provide the same effect as the conventional two-step irradiation system using a weak pulse laser beam for preliminary heating and a strong pulse laser beam for crystallization.

Since the energy applied to a region to be irradiated is not rapidly changed, a phase is not rapidly changed in the silicon film, and the roughness of the surface, the storage of the internal stress, etc., are prevented, thereby obtaining a uniform crystallinity.

Also, in this example, the atmospheric control is not particularly conducted, and the irradiation of the laser beam is conducted in the atmosphere. It may be conducted under the vacuum or the atmosphere of an inactive gas such as argon or helium, hydrogen or nitrogen (FIG. 1B).

Then, a TFT is fabricated as a semiconductor device using the crystalline silicon film thus fabricated in accordance with the producing process as in the first embodiment. The TFT is arranged in the form of a matrix on the substrate. Specifically, TFTs of 400×300 pieces are fabricated in a producing area of 40×50 mm$^2$.

The distribution of the threshold values of the TFTs using the crystalline silicon film formed in accordance with this embodiment within the substrate surface is uniform as shown in FIG. 5 as in the first embodiment.

Third Embodiment

Although in the second embodiment, the glass substrate 101 of 400×500 mm square is used, in a third embodiment, Corning 7059 of 100 mm square is used for a glass substrate. Hence, in flattening the glass substrate which has been subjected to the crystallizing process, the shape of a stage on which the glass substrate shown in FIG. 6A is mounted may be of the inverse U-shape type convex curved surface which is curved in one direction.

The glass substrate is put on the stage having the inverse U-shape type convex curved surface, and an appropriate heat is applied to the glass substrate. Then, the glass substrate is deformed along the stage by self-weight and heat. In this situation, when the glass substrate is cooled, the silicon film formed on the substrate contracts more sharply than the glass substrate, with the result that an extremely flat glass substrate can be obtained.

Thereafter, a TFT is fabricated in the same manner as that of the first embodiment.

The distribution of the threshold voltage of the TFT is extremely uniform within the substrate surface in comparison with the TFT manufactured without flattening the glass substrate, as in the first embodiment.

Fourth Embodiment

A fourth embodiment will be described with reference to FIGS. 1A to 1F.

An under silicon oxide film 102 having a thickness of 2000 Å is formed on a glass substrate 101 (In this embodiment, there is used a Corning 1737 of 400×500 mm square and 0.7 mm thickness. It is needless to say that another glass substrate such as Corning 7059, OA2, NA45, etc., may be used.), and an amorphous silicon film 103 having a thickness of 500 Å is sequentially formed on the under silicon oxide film 102 by plasma CVD.

Then, nickel acetate aqueous solution of 10 ppm is coated on the surface of silicon, and a nickel acetate layer is formed by spin coating. It is more preferable that a surface active agent is added to the nickel acetate aqueous solution. Since the nickel acetate layer is very thin, although it is not necessarily to be in a film shape, it does not suffer from any problem in the subsequent process (FIG. 1A).

Then, the glass substrate is located on the convex stage (the rising portion in the center of a region on which the substrate is mounted is higher in level than the edge of that region), and then thermally annealed at 550° C. for four hours, to crystallize the amorphous silicon film.

In this situation, the glass substrate is deformed along the stage by self-weight and heat.

Also, in this state, nickel serves as the core of crystal, to thereby promote the crystallization of the silicon film. It should be noted that the strain point of the Corning 1737 substrate is 667° C., and the annealing temperature of 550° C. is below the strain point.

That the processing can be made at a low temperature (the strain point of the Corning 1737 or less) for a short period of time, that is, at 550° C. for four hours is caused by the function of nickel. The details are disclosed in Japanese Patent Unexamined Publication No. 6-244104. The publication discloses that the thermal annealing, for example, at 550° C. (below the strain point) for four hours is conducted so that the temperature in thermally annealing does not exceed the strain point of the glass substrate. However, the temperature is determined so that the glass substrate is prevented from being remarkably deformed in thermally crystallizing.

It is preferable that the concentration of a catalytic element is $1 \times 10^{15}$ to $1 \times 10^{19}$ atoms/cm$^3$. When it is a high concentration equal to or more than $1 \times 10^{19}$ atoms/cm$^3$, a metallic nature is exhibited on silicon, whereby the semiconductor characteristic disappears. The concentration of the catalytic element in the silicon film in this embodiment is $1 \times 10^{17}$ to $5 \times 10^{18}$ atoms/cm$^3$ at the minimum in the film. It should be noted that those values are the minimum values of the concentration of the catalytic elements in the silicon film which has been analyzed and measured by the secondary ion mass spectrometry (SIMS).

After the thermal crystallization, when the glass substrate is cooled, the glass substrate is flattened because its coefficient of contraction is larger than that of the glass substrate.

In order to further enhance the crystallinity of the crystalline silicon film thus obtained, an excimer laser beam which is a high-power pulse laser is irradiated onto the film. A KrF excimer laser (248 nm in wavelength and 30 nsec in pulse width) is processed into a linear shape before being used. The size of a laser beam is 1×125 mm$^2$. The irradiation of the laser beam is conducted with the energy density of the laser beam being within 100 mJ/cm$^2$ to 500 mJ/cm$^2$, for example, 370 mJ/cm². The crystallinity is further enhanced by irradiating a laser beam onto the film with an energy of about 220 mJ/cm² in advance before the above irradiation of the laser beam.

The laser irradiating method is as follows. The linear laser beam is irradiated onto the film while being shifted relatively with respect to an object to be irradiated. A direction in which the linear laser beam is shifted is substantially perpendicular to the linear laser. In this situation, paying an attention to one point of a surface to be irradiated, the laser beams of 2 to 20 shots are irradiated onto the point. Also, the substrate temperature at the time of irradiating the laser beam is 200° C. (FIG. 1B).

Thereafter, a TFT is fabricated in the same manner as that of the first embodiment.

The distribution of the threshold voltage of the TFT thus obtained is extremely unified within the substrate surface in comparison with the TFT manufactured without flattening the glass substrate, as in the first embodiment.

Also, although in this embodiment, the glass substrate 101 of 400 mm×500 mm square is used, in the case of using Corning 7059 of 100 mm square as the glass substrate 101 as in the third embodiment, the shape of the stage on which the glass substrate shown in FIG. 6A is mounted may be changed to the inverse U-shape type convex curved surface which is curved in one direction, in flattening the glass substrate which has been crystallized.

Fifth Embodiment

A fifth embodiment will be described with FIGS. 1A to 1F.

An under silicon oxide film 102 having a thickness of 2000 Å is formed on a glass substrate 101 (In this embodiment, there is used a Corning 1737 of 400×500 mm square and 0.7 mm thickness. Another glass substrate such as Corning 7059, OA2, NA45, etc., may be used.), and an amorphous silicon film 103 having a thickness of 500 Å is then formed on the under silicon oxide film 102 by plasma CVD. Then, nickel acetate aqueous solution of 10 ppm is coated on the surface of silicon, and a nickel acetate layer is formed by spin coating. It is more preferable that a surface active agent is added to the nickel acetate aqueous solution. Since the nickel acetate layer is very thin, although it is not necessarily to be in a film shape, it does not suffer from any problem in the subsequent process (FIG. 1A).

Then, the glass substrate is thermally annealed at 550° C. for four hours, to crystallize the amorphous silicon film. In this state, nickel serves as the core of crystal, to promote the crystallization of the silicon film. The strain point of the Corning 1737 substrate is 667° C., and the annealing temperature of 550° C. is below the strain point.

After the thermal crystallization, when the glass substrate is cooled, the silicon film contracts, to thereby warp the glass substrate in the form of a concave.

That the processing can be made at a low temperature (the strain point of the Corning 1737 or less) for a short period of time, that is, at 550° C. for four hours is caused by the function of nickel. The details are disclosed in Japanese Patent Unexamined Publication No. 6-244104. The publication discloses that the thermal annealing, for example, at 550° C. (below the strain point) for four hours is conducted so that the temperature in thermally annealing does not exceed the strain point of the glass substrate. However, the temperature is determined so that the glass substrate is prevented from being remarkably deformed in thermally crystallizing.

It is preferable that the concentration of a catalytic element is $1\times10^{15}$ to $1\times10^{19}$ atoms/cm³. When it is a high concentration equal to or more than $1\times10^{19}$ atoms/cm³, a metallic nature is exhibited on silicon, whereby the semiconductor characteristic disappears. The concentration of the catalytic element in the silicon film in this embodiment is $1\times10^{17}$ to $5\times10^{18}$ atoms/cm³ at the minimum in the film. It should be noted that those values are the minimum values of the concentration of the catalytic elements in the silicon film which has been analyzed and measured by SIMS.

In order to further enhance the crystallinity of the crystalline silicon film thus obtained, an excimer laser beam which is a high-power pulse laser is irradiated onto the film while heating the film. In this situation, the glass substrate which has been warped in the form of a concave is flattened simultaneously.

In this embodiment, a KrF excimer laser (248 nm in wavelength and 30 nsec in pulse width) is used. The size of a laser beam is 30×20 mm². The irradiation of the laser beam is conducted with the energy density of the laser beam being within 100 mJ/cm² to 500 mJ/cm², for example, 370 mJ/cm². The crystallinity is further enhanced by irradiating a laser beam onto the film with an energy of about 220 mJ/cm² in advance before the above irradiation of the laser beam.

Figure 8:
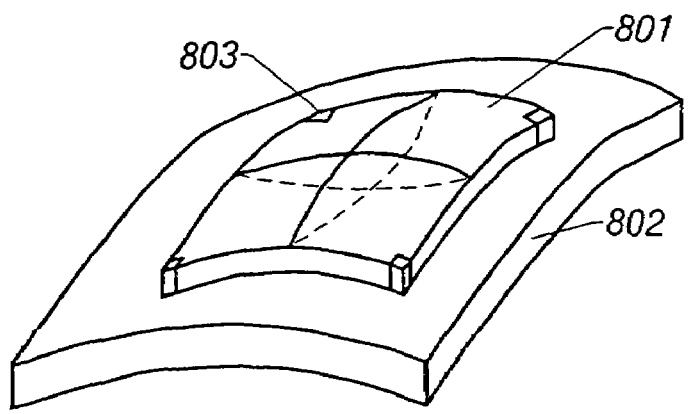
FIG. 8 shows the producing method of the embodiment.

The laser irradiating method is as follows:

The glass substrate, as shown in FIG. 8, is mounted on a convex stage, and the edges of the glass substrate are fixedly pushed by appropriate pushers 803 made of metal or the like, to thereby deform the substrate into a convex shape.

Figure 9:
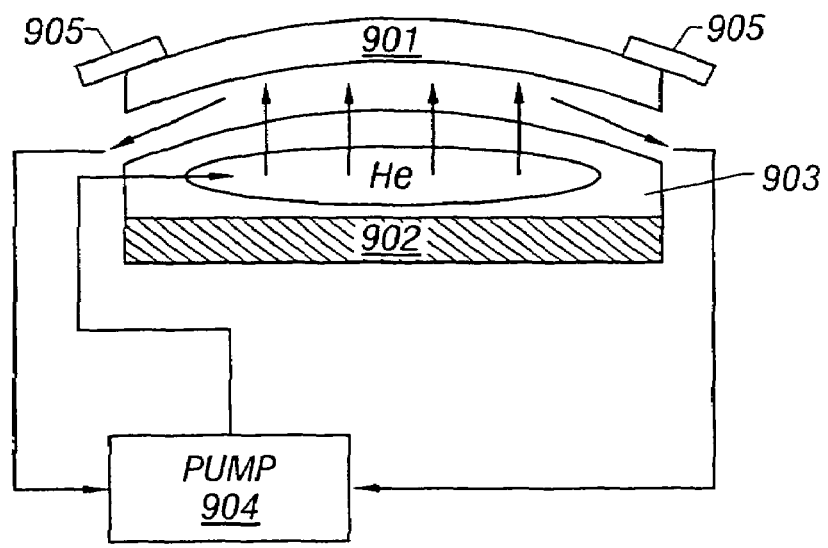
FIG. 9 shows a substrate heating unit.

The stage has a mechanism that allows heated helium gas to flow out and circulate by a pump 904, under the substrate 901, as shown in FIG. 9, to thereby keep the substrate at a desired temperature.

In this situation, a laser processing is conducted on the substrate. A laser beam is moved back and forth, right and left, and is irradiated on the substrate so as to be overlapped with each other. Paying an attention to a certain point on the substrate, the number of times of laser irradiation is 2 to 5.

It should be noted that, because the substrate to be irradiated is warped in the form of a convex, the glass substrate is moved vertically with respect to the laser beam so that the focal point of the laser beam is always put on the substrate. Since the thickness of the substrate, the shape of the convex surface, and so on are found in advance, the height of the substrate is controlled on the basis of those data so that annealing can be uniformly conducted on the convex substrate surface, keeping the focal point constant.

The height of the substrate may be fixed, and a lens is so adjust as to move the focal point in such a manner that the focal point of the laser beam is always set on the substrate.

Also, a distance to a surface to be irradiated is measured using a displacement gauge or the like, on the basis of which the height of the substrate or the focal point may be automatically changed. Moreover, the substrate temperature at the time of irradiating a laser beam is 200° C.

Thereafter, the pushers are detached from the substrate, and the substrate is cooled, to thereby flatten the substrate with the contraction of the silicon film (FIG. 1B).

In this manner, the silicon film uniform in crystallinity within substrate surface and the flat substrate having the film can be obtained.

TFT is fabricated in the same manner as that of the first embodiment.

The distribution of the threshold voltage of the TFT is extremely unified within the substrate surface in comparison with the TFT manufactured without flattening the glass substrate, as in the first embodiment.

Sixth Embodiment

A sixth embodiment will be described with reference to FIGS. 1A to 1F.

An under silicon oxide film 102 having a thickness of 2000 Å is formed on a glass substrate 101 (In this embodiment, there is used a Corning 1737 of 400×500 mm square and 0.7 mm thickness. It is needless to say that another glass substrate such as Corning 7059, OA2, NA45, etc., may be used.), and an amorphous silicon film 103 having a thickness of 500 Å is sequentially formed on the under silicon oxide film 102 by plasma CVD.

Then, nickel acetate aqueous solution of 10 ppm is coated on the surface of silicon, and a nickel acetate layer is formed by spin coating. It is more preferable that a surface active agent is added to the nickel acetate aqueous solution. Since the nickel acetate layer is very thin, although it is not necessarily to be in a film shape, it does not suffer from any problem in the subsequent process (FIG. 1A).

Then, the glass substrate is thermally annealed at 550° C. for four hours, to thereby crystallize the amorphous silicon film. In this state, nickel serves as the core of crystal, to thereby promote the crystallization of the silicon film. It should be noted that the strain point of the Corning 1737 substrate is 667° C., and the annealing temperature of 550° C. is below the strain point.

After the thermal crystallization, when the glass substrate is cooled, the silicon film contracts, to warp the glass substrate in the form of a concave.

That the processing can be made at a low temperature (the strain point of the Corning 1737 or less) for a short period of time, that is, at 550° C. for four hours is caused by the function of nickel. The details are disclosed in Japanese Patent Unexamined Publication No. 6-244104. The publication discloses that the thermal annealing, for example, at 550° C. (below the strain point) for four hours is conducted so that the temperature in thermally annealing does not exceed the strain point of the glass substrate. However, the temperature is determined so that the glass substrate is prevented from being remarkably deformed in thermally crystallizing.

It is preferable that the concentration of a catalytic element is $1 \times 10^{15}$ to $1 \times 10^{19}$ atoms/cm$^3$. When it is a high concentration equal to or more than $1 \times 10^{19}$ atoms/cm$^3$, a metallic nature is exhibited on silicon, whereby the semiconductor characteristic disappears. The concentration of the catalytic element in the silicon film in this embodiment is $1 \times 10^{17}$ to $5 \times 10^{18}$ atoms/cm$^3$ at the minimum in the film. It should be noted that those values are the minimum values of the concentration of the catalytic elements in the silicon film which has been analyzed and measured by SIMS.

In order to further enhance the crystallinity of the crystalline silicon film thus obtained, an excimer laser beam which is a high-power pulse laser is irradiated onto the film while heating the film. In this situation, the glass substrate which has been warped in the form of a concave is flattened simultaneously.

The laser irradiating method is as follows The laser annealing unit shown in FIG. 12 is used as in the first embodiment.

An oscillator as used is a model 3000-308 made by Lambda Physic Corporation. The laser beam oscillated from the oscillator is an XeCl excimer laser beam (308 nm in wavelength and 26 ns in pulse width).

Another excimer laser as well as another type laser can be used. It should be noted that a laser beam of a pulse oscillator need to be used. The oscillated laser beam is introduced into an optical system as shown in FIGS. 14A and 14B in order to deform the beam shape.

The laser beam immediately before being shone onto the optical system is rectangular to the degree of 3×2 cm$^2$, but it is processed by the optical system into a slender beam (linear beam) of about 10 to 30 cm in length and 0.01 to 0.3 cm in width.

The distribution of the energy density of the linear laser beam that has passed through the optical system in the cross direction is trapezoidal as shown in FIG. 15B. The energy of the laser beam that has passed through the optical system is 1000 mJ/shot at the maximum.

The reason why the laser beam is processed into such a slender beam is to improve the processability. When the linear beam is irradiated onto an sample, if the length of the laser beam is longer than the width of the sample, then the sample is moved in one direction, thereby irradiating a laser beam onto the entire sample.

Even though the length of the beam is shorter than the width of the sample, troublesomeness in processing is saved in comparison with the rectangular beam. However, in this case, there occurs the necessity of moving the beam vertically and horizontally relatively with respect to the sample.

The stage (base) for the substrate (sample) on which a laser beam is irradiated is controlled by a computer and so designed as to be moved perpendicularly to the line direction of the linear laser beam. Also, it is so designed that the height of the substrate can fluctuate.

If the stage is provided with a function for moving in the line direction of the laser beam, even though the beam width is shorter than the sample, a laser processing on the entire sample is enabled.

The optical path in the interior of the optical system that processes a laser beam into a linear laser beam will be described.

The laser beam oscillated from a laser light source a and incident to the optical system first passes through fly eye lenses b and c.

The laser beam passes through a cylindrical convex lens d as a first cylindrical lens, and a cylindrical convex lens e as a second cylindrical lens provided for improving the uniformity of the linear beam in the line direction, and is then converged by the cylindrical convex lens g via a mirror f before being irradiated onto the sample.

A distance of from the laser light source to the mirror g is 2000 mm, and a distance of from the mirror f to the surface to be irradiated is 440 mm. The cylindrical lens g as used has a focal distance of 100 mm.

The shape of the energy distribution of the laser beam at the focal point is made trapezoidal by changing the lens g vertically (i-direction).

The surface to be irradiated is moved vertically (i-direction) relatively with respect to the lens g, thereby deforming the shape of the energy distribution of the laser beam on the surface to be irradiated (focal point) with a range of from a nearly square shape to a nearly trapezoidal shape.

The optical system is not particularly limited if it is so designed as to deform the laser beam to the shape required by the present invention.

The optical system is not limited to that shown in FIGS. 14A and 14B, but it may be provided with lenses B and C as shown in FIGS. 13A and 13B.

The laser beam is shaped into a linear form, and the area of a laser beam on the surface to be irradiated is 150 mm×0.4 mm. (The width of the linear laser beam is half of the maximum energy value of the laser beam.)

The energy profile (energy distribution) of the linear laser beam in the cross direction has an artificial trapezoidal distribution of L1=0.1 mm and L2, L3=0.08 mm as shown in FIG. 15B, which satisfies the inequality of $0.5L1 \leq L2 \leq L1$, $0.5L \leq L3 \leq L1$. In this case, the focal depth can be about ±400 μm.

The degree of widening of the bottom of the trapezoidal distribution is changed in accordance with a distance between the final lens of the laser optical system and the surface to be irradiated. A distance between the final lens of the laser optical system and the surface to be irradiated is changed by the roughness of the object to be irradiated during the laser processing.

With any change of the distance between the final lens and the surface to be irradiated, the degree of widening of the bottom of the trapezoidal distribution of the laser beam is changed. If a range of the change is within a range of the above inequality, then the focal depth of about ±400 μm is obtained, and therefore when the roughness of the surface to be irradiated is ±400 μm or less, the uniform laser processing is enabled.

The general laser beam having a square energy distribution is about ±200 μm or less in focal depth.

Figure 10:
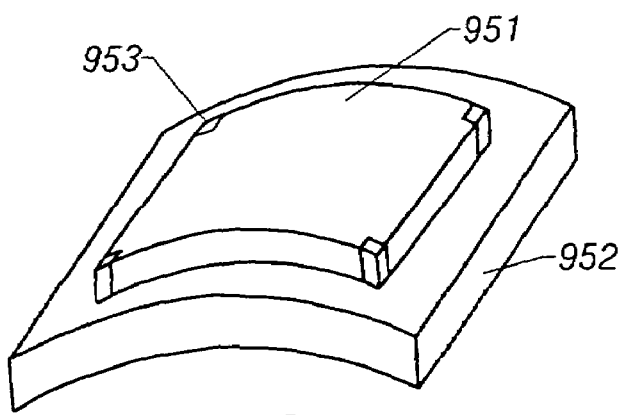
FIG. 10 shows the producing method of the embodiment.

The glass substrate, as shown in FIG. 10, is mounted on a U-shaped convex stage, and the edges of the glass substrate are fixedly pushed by appropriate pushers made of metal or the like, to curve the substrate into a U-shape.

The stage has a mechanism that allows heated helium gas to flow out and circulate, under the substrate, as shown in FIG. 9, to thereby keep the substrate at a desired temperature. The laser processing is conducted while the linear laser beam is being shifted relatively with respect to the object to be irradiated. A direction in which the linear laser beam is shifted is substantially perpendicular to the linear laser beam, and a straight line contained in the U-shaped curved surface of the substrate to be irradiated is substantially in parallel with the linear laser beam.

Figure 11:
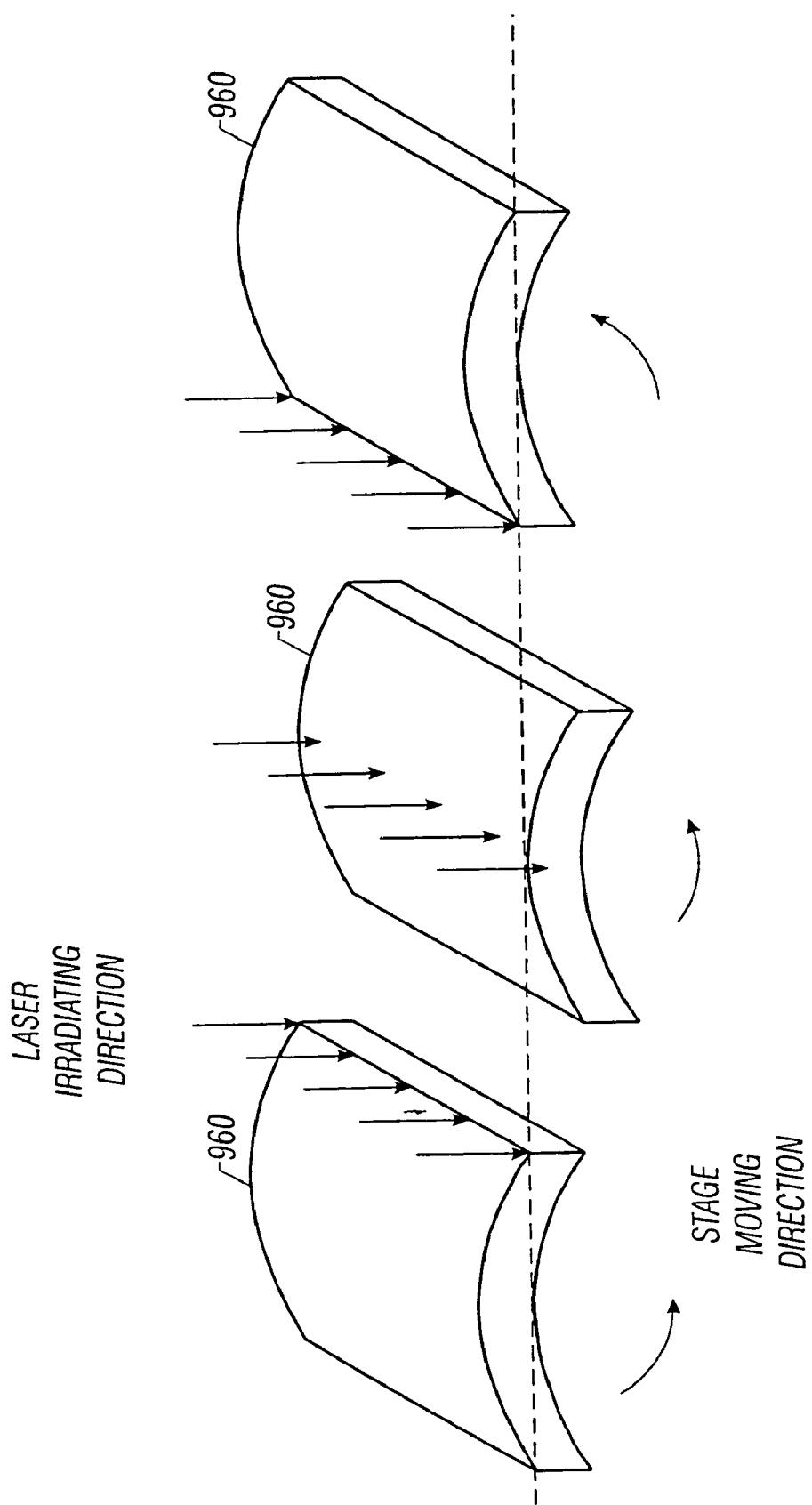
FIG. 11 shows a laser irradiating method.

Because the substrate to be irradiated is warped in the form of a U-shape, as shown in FIG. 11, the glass substrate is moved vertically with respect to the laser beam so that the focal point of the laser beam is always put on the substrate, during the irradiation of a laser beam.

Since the thickness of the substrate, the shape of the convex surface, and so on are found in advance, the height of the substrate is controlled on the basis of those data so that annealing can be uniformly conducted on the U-shaped surface of the substrate, keeping the focal point constant.

The height of the substrate may be fixed, and a lens is so adjust as to move the focal point in such a manner that the focal point of the laser beam is always set on the substrate.

Also, a distance to a surface to be irradiated is measured using a displacement gauge or the like, on the basis of which the height of the substrate or the focal point may be automatically changed.

The substrate temperature at the time of irradiating a laser beam is 200° C.

Since the energy distribution of a laser beam to be irradiated is trapezoidal, and the focal depth is about ±400 μm, if a difference in level between the central portion and the edge portion of the U-shaped convex stage is about ±400 μm or less, the laser annealing can be uniformly conducted within the substrate surface even though the stage and the focal point are not varied at all.

The laser annealing can be extremely uniformly conducted if the stage or the focal point is varied in accordance with a difference in level of the surface to be irradiated, using a laser beam having such a focal depth.

The glass substrate on the stage is moved perpendicular to the line width direction at 2.5 mm/s.

The laser irradiation conditions are that the energy density of the laser beam is 100 to 500 mJ/cm$^2$, in this example, 400 mJ/cm$^2$, and the number of pulses is 200 pulses/s. It should be noted that the energy density means the density of the upper bottom portion (a portion having a maximum value) of the trapezoidal laser beam.

The irradiation of the laser beam is conducted under the above conditions. Paying an attention to a certain point of the sample, the laser beams are irradiated at 32 steps. This is because, since it takes 0.4 sec to allow one laser beam to pass, 32 pulses are irradiated on one location by irradiating one laser beam in the scanning manner. In this example, in the above 32 irradiations, the initial several irradiations have the irradiated energy density gradually increased, and the final several irradiations have the irradiated energy density gradually decreased.

This state is schematically shown in FIG. 16. In the first half of 32 steps, the laser energy gradually increases (see A in FIG. 16) whereas, in the latter half thereof, it gradually decreases (see B in FIG. 16).

Also, in this example, the atmospheric control is not particularly conducted, and the irradiation of the laser beam is conducted in the atmosphere. It may be conducted under the vacuum or the atmosphere of an inactive gas such as argon or helium, hydrogen or nitrogen.

Thereafter, the pushers are detached from the substrate and then cooled so that the substrate is flattened with the contraction of the silicon film (FIG. 1B).

The silicon film uniform in crystallinity within the substrate surface and the flat substrate having the film can be obtained. Thereafter, a TFT is fabricated in the same manner as in the first embodiment.

The distribution of the threshold voltage of the TFT thus obtained is extremely unified within the substrate surface in comparison with the TFT manufactured without flattening the glass substrate, as in the first embodiment.

Seventh Embodiment

A seventh embodiment will be described with reference to FIGS. 1A to 1F.

An under silicon oxide film 102 having a thickness of 2000 Å is formed on a glass substrate 101 (In this embodiment, there is used a Corning 1737 of 400×500 mm square and 0.7 mm thickness. It is needless to say that another glass substrate such as Corning 7059, OA2, NA45, etc., may be used.), and an amorphous silicon film 103 having a thickness of 500 Å is sequentially formed on the under silicon oxide film 102 by plasma CVD.

In order to crystallize the amorphous silicon film, an excimer laser beam which is a high-power pulse laser is irradiated onto the film while heating the film.

A KrF excimer laser (248 nm in wavelength and 30 nsec in pulse width) is used. The size of a laser beam is 30×20 mm$^2$. The laser beam is irradiated with the energy density of the laser beam being within 100 mJ/cm$^2$ to 500 mJ/cm$^2$, for example, 370 mJ/cm$^2$. The crystallinity is further enhanced by irradiating a laser beam onto the film with an energy of about 220 mJ/cm$^2$ in advance before the irradiation of the laser beam.

In this state, in order to prevent the substrate from being warped by the contraction of the silicon film after the silicon film is crystallized and cooled, the laser irradiating method is conducted as follows:

The glass substrate, as shown in FIG. 8, is mounted on a convex stage, and the edges of the glass substrate are fixedly pushed by appropriate pushers made of metal or the like, to thereby deform the substrate into a convex shape.

The stage has a mechanism that allows heated helium gas to flow out and circulate under the substrate, as shown in FIG. 9, to thereby keep the substrate at a desired temperature.

In this situation, a laser processing is conducted on the substrate. A laser beam is moved back and forth, right and left, and is irradiated on the substrate so as to be overlapped with each other.

Paying an attention to a certain point on the substrate, the number of times of laser irradiation is 2 to 5.

Because the substrate to be irradiated is warped in the form of a convex, the glass substrate is moved vertically with respect to the laser beam so that the focal point of the laser beam is always put on the substrate. Since the thickness of the substrate, the shape of the convex surface, and so on are found in advance, the height of the substrate is controlled on the basis of those data so that annealing can be uniformly conducted on the convex substrate surface, keeping the focal point constant.

The height of the substrate is fixed, and a lens is so adjust as to move the focal point in such a manner that the focal point of the laser beam is always set on the substrate.

Also, a distance to a surface to be irradiated is measured using a displacement gauge or the like, on the basis of which the height of the substrate or the focal point may be automatically changed.

The substrate temperature at the time of irradiating a laser beam is 200° C.

Thereafter, the pushers are detached from the substrate, and the substrate is cooled, to thereby flatten the substrate with the contraction of the silicon film (FIG. 1B).

In this manner, the silicon film uniform in crystallinity within substrate surface and the flat substrate having the film can be obtained. Thereafter, a TFT is fabricated in the same manner as in the first embodiment.

The distribution of the threshold voltage of the TFT thus obtained is extremely unified within the substrate surface in comparison with the TFT manufactured without flattening the glass substrate, as in the first embodiment.

Eighth Embodiment

An eighth embodiment will be described with reference to FIGS. 1A to 1F.

An under silicon oxide film 102 having a thickness of 2000 Å is formed on a glass substrate 101 (In this embodiment, there is used a Corning 1737 of 400×500 mm square and 0.7 mm thickness. It is needless to say that another glass substrate such as Corning 7059, OA2, NA45, etc., may be used.), and an amorphous silicon film 103 having a thickness of 500 Å is sequentially formed on the under silicon oxide film 102 by plasma CVD.

In order to crystallize the amorphous silicon film, an excimer laser beam which is a high-power pulse laser is irradiated onto the film while heating the film. In this process, the glass substrate which has been warped in the form of a concave is flattened simultaneously.

In this embodiment, crystallization is conducted using a laser annealing unit having the optical system shown in FIGS. 14A and 14B, as in the fourth embodiment. Various conditions for the laser annealing are the same as those in the fourth embodiment.

The glass substrate is mounted on a U-shaped convex stage as shown in FIG. 10, which is disposed in a laser annealing chamber of the laser annealing unit shown in FIG. 12, and the edges of the glass substrate are fixedly pushed by pushers made of metal or the like, to curve the substrate into a U-shape.

The stage has a mechanism that allows heated helium gas to flow out and circulate under the substrate, as shown in FIG. 9, to maintain the substrate at a desired temperature.

The laser processing is conducted while the linear laser beam is being shifted relatively with respect to the object to be irradiated. A direction in which the linear laser beam is shifted is substantially perpendicular to the linear laser beam, and a straight line contained in the U-shaped curved surface of the substrate to be irradiated is substantially in parallel with the linear laser beam.

Because the substrate to be irradiated is warped in the form of a convex U-shape, as shown in FIG. 11, the glass substrate is moved vertically with respect to the laser beam so that the focal point of the laser beam is always put on the substrate, during the irradiation of a laser beam.

Since the thickness of the substrate, the shape of the convex surface, and so on are found in advance, the height of the substrate is controlled on the basis of those data so that annealing can be uniformly conducted on the U-shaped surface of the substrate, keeping the focal point constant.

The height of the substrate may be fixed, and a lens is so adjust as to move the focal point in such a manner that the focal point of the laser beam is always set on the substrate.

Also, a distance to a surface to be irradiated is measured using a displacement gauge or the like, on the basis of which the height of the substrate or the focal point may be automatically changed.

Since the energy distribution of a laser beam to be irradiated is trapezoidal, and the focal depth is about ±400 μm, if a difference in level between the central portion and the edge portion of the U-shaped convex stage is about ±400 μm or less, the laser annealing can be uniformly conducted within the substrate surface even though the stage and the focal point are not varied at all.

That the laser annealing can be extremely uniformly conducted if the stage or the focal point is varied in accordance with a difference in level of the surface to be irradiated, using a laser beam having such a focal depth.

Moreover, the substrate temperature at the time of irradiating a laser beam is 200° C.

Thereafter, the pushers are detached from the substrate, and the substrate is cooled, to flatten the substrate with the contraction of the silicon film (FIG. 1B).

In this manner, the silicon film uniform in crystallinity within substrate surface and the flat substrate having the film can be obtained. Thereafter, a TFT is fabricated in the same manner as in the first embodiment.

The distribution of the threshold voltage of the TFT is extremely unified within the substrate surface in comparison with the TFT produced without flattening the glass substrate, as in the first embodiment.

Ninth Embodiment

A process of producing a TFT in accordance with a ninth embodiment will be described with reference to FIGS. 1A to 1F.

An under silicon oxide film 102 having a thickness of 2000 Å is formed on a glass substrate 101 (In this embodiment, there is used a Corning 7059 of 100 mm square. Another glass substrate such as Corning 1737, OA2, NA45, etc., may be used.), and an amorphous silicon film 103 having a thickness of 500 Å is then formed on the under silicon oxide film 102 by plasma CVD.

Then, nickel acetate aqueous solution of 10 ppm is coated on the surface of silicon, and a nickel acetate layer is formed by spin coating. It is more preferable that a surface active agent is added to the nickel acetate aqueous solution. Since the nickel acetate layer is very thin, although it is not necessarily to be in a film shape, it does not suffer from any problem in the subsequent process (FIG. 1A).

Then, the glass substrate is thermally annealed at 550° C. for four hours, to crystallize the amorphous silicon film. In this state, nickel serves as the core of crystal, to promote the crystallization of the silicon film.

That the processing can be made at a low temperature (the strain point of the Corning 7059 or less) for a short period of time, that is, at 550° C. for four hours is caused by the function of nickel. The details are disclosed in Japanese Patent Unexamined Publication No. 6-244104.

It is preferable that the concentration of a catalytic element is $1\times10^{15}$ to $1\times10^{19}$ atoms/cm$^3$. When it is a high concentration equal to or more than $1\times10^{19}$ atoms/cm$^3$, a metallic nature is exhibited on silicon, whereby the semiconductor characteristic disappears. The concentration of the catalytic element in the silicon film in this embodiment is $1\times10^{17}$ to $5\times10^{18}$ atoms/cm$^3$ at the minimum in the film. It should be noted that those values are the minimum values of the concentration of the catalytic elements in the silicon film which has been analyzed and measured by SIMS.

In this way, a crystalline silicon film is obtained.

In this situation, the glass substrate is warped on the surface on which the crystalline silicon film is formed, so as to be concave. A difference in level between the central portion and the peripheral portion of the substrate is about 50 μm. The degree of warp is different depending on the size, the thickness and the kind of the glass substrate.

In order to further enhance the crystallinity of the crystalline silicon film, an excimer laser beam which is a high-power pulse laser is irradiated onto the film.

In this embodiment, there is used the laser annealing unit described with reference to the second embodiment shown in FIGS. 12, 13A and 13B.

FIG. 17 shows an example of the structure of the stage.

As an example of means for fixedly mounting the flattened glass substrate on the stage, there is, for example, provided a plurality of suction inlets 202 on the upper surface of a stage 201. The suction inlets 202 are holes, and a flat surface is formed at portions where no suction inlet 202 exists.

Figure 17A:
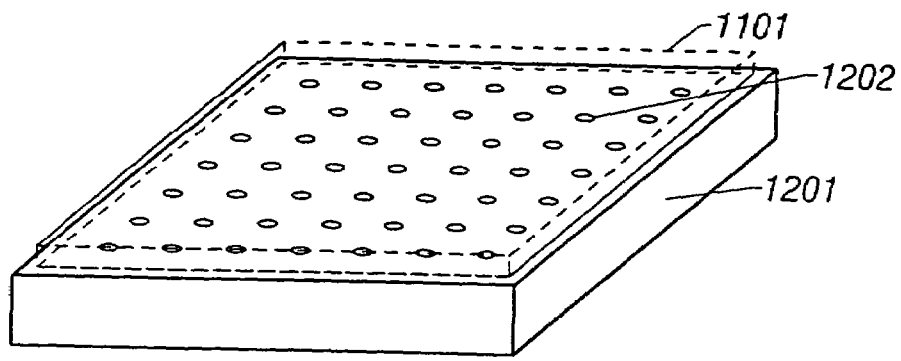
FIGS. 17A to 17D are structural diagrams showing another stage.
Figure 17B:
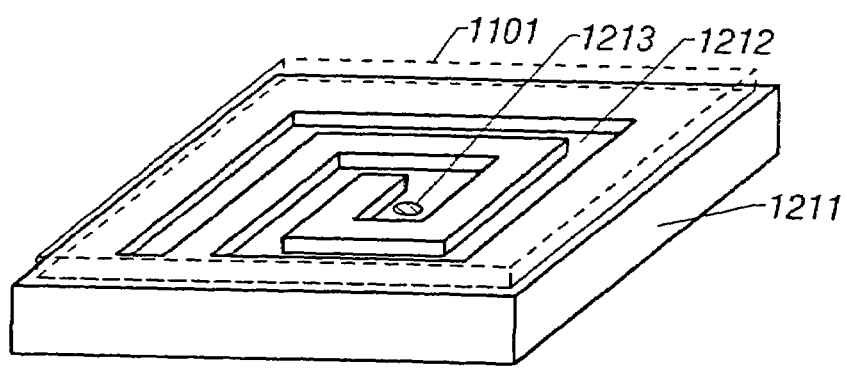

FIG. 17B shows that a groove 212 is defined in the upper surface of the stage 211. The groove 212 communicates with a suction inlet 213 in the center of the stage, and a flat surface is formed at portions where no groove 212 exists.

Figure 17C:
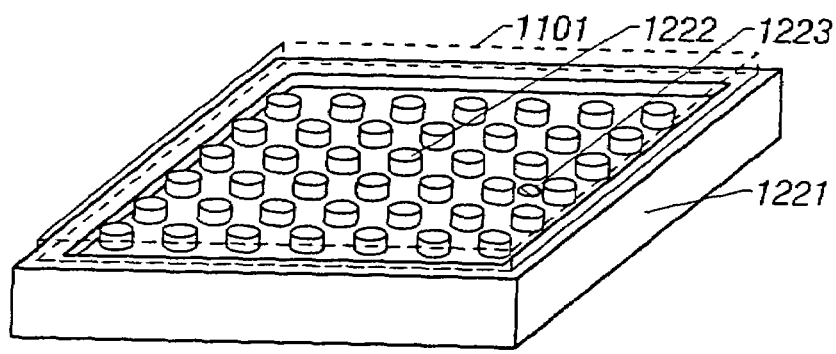

FIG. 17C shows that a plurality of protrusions 222 are provided on the upper surface of a stage 221, and a flat surface is formed by the upper surface of those protrusions 222 and the peripheral portion of the stage. Also, a suction inlet 223 is provided for making vacuous.

FIGS. 17A to 17D show that the glass substrate is vacuum-sucked onto the flat surface by making vacuous through the suction inlet 1223. In this manner, the lower surface of the glass substrate is in close contact with the flat surface of the stage. Then, in this state, the laser annealing is conducted.

Because the flat surface on the upper surface of the stage is flat except for the portion taking part in the suction, the glass substrate in contact with the above flat upper surface is flattened in accordance with the flat surface of the stage.

In this vacuum-suction method, the location and the detachment of the glass substrate are performed extremely readily and for a short time. Also, because no obstruction that prevents the irradiation of a laser beam exists on the glass substrate surface, the laser beam is uniformly irradiated onto the entire surface of the glass substrate.

The flat surface of the stage is preferably as flat as possible. However, it is sufficient that the crystalline silicon film on the glass substrate mounted on the flat surface can be annealed using a linear laser beam so that the film has the uniformity of a required level.

For example, the flat surface is so formed that a difference in level on the surface to be irradiated, of the glass substrate is at least the focal depth of the laser beam or less.

The method of bringing the glass substrate in close contact with the stage is not limited to the above suction method, and any kind of method may be used if the glass substrate can be flattened and the laser annealing can be conducted.

Figure 17D:
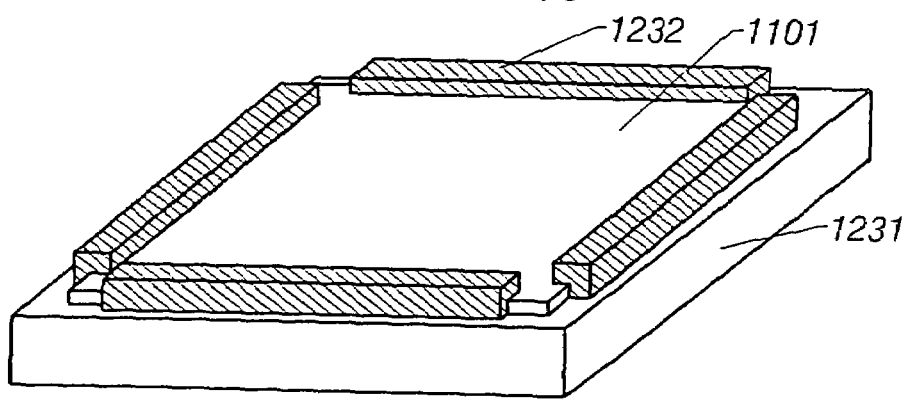

As another method, for example, in FIG. 17D, the peripheral portion or the edge portions on the upper surface of the glass substrate 1101 are mechanically pushed and pressed (pressurized) against the flat surface of the stage 1231 by pushers 1232, and in this situation, the laser annealing may be conducted.

In that case, because the glass substrate can be flattened by a stronger force than the vacuum suction, the glass substrate which is strongly warped to the degree that it cannot be sufficiently flattened by vacuum suction can be readily flattened.

The method shown in FIG. 17D and the above suction method may be used together.

The material of the stage is preferably quartz, metal, ceramics or the like because they are high in heat resistance and keep the flatness high. In this example, there is used the stage having the structure shown in FIG. 17A.

The suction inlets 1202 shown in FIG. 17A are about 1 mm in diameter and provided at the intervals of 10 mm.

The glass substrate 1101 is placed on the flat surface of the stage 1201 in such a manner that a surface of the glass substrate 1101 on which a crystalline silicon film 1103 has been formed is directed upwardly, and vacuum is made from the suction inlets 1202 so that the glass substrate 1101 is brought in close contact with the stage.

The glass substrate 1101 is also flattened to the same degree as a difference in level within the flat surface of the stage 1201 in accordance with the flat surface of the stage 1201.

In addition to the structure of FIG. 17A, not only the glass substrate 1101 is merely placed on the stage 1201, but also, after the former is placed on the latter, vacuum is made in a state where a press is applied to the upper surface of the substrate, in particular, the upper surface of the peripheral portion, and vacuum is then made so that the glass substrate is brought in close contact with the stage. For example, pushers 1232 shown in FIG. 17D is provided so that the upper surface of the peripheral portion of the glass substrate 1101 is pushed, and vacuum is made to bring the glass substrate in close contact with the stage. Then, the pushers are detached from the glass substrate, and thereafter the laser annealing is conducted.

Figure 18A:
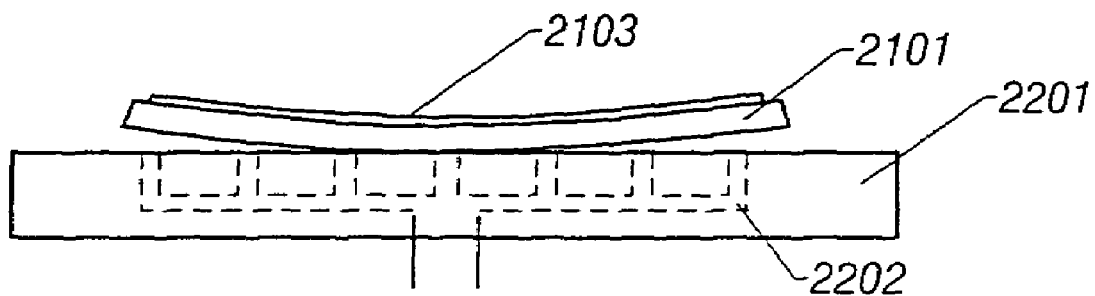
FIGS. 18A to 18C show a laser irradiating process.
Figure 18B:
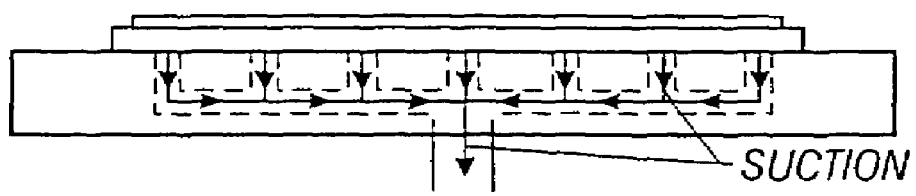
Figure 18C:
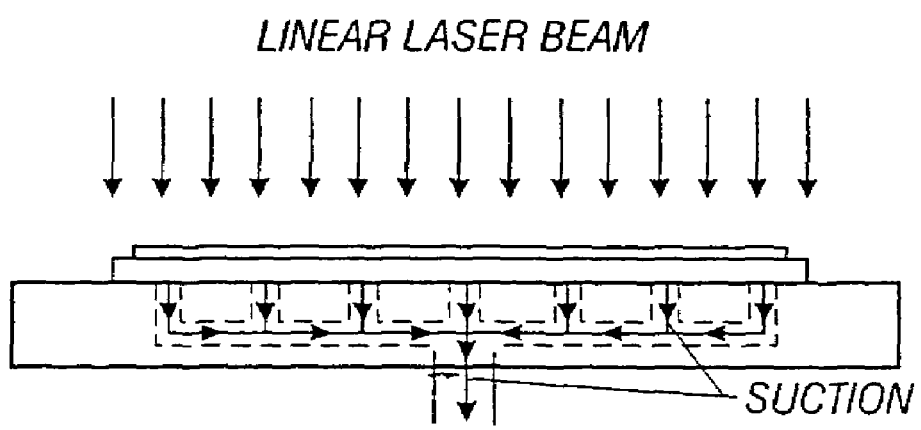

FIGS. 18A to 18C show a process of irradiating a laser beam in accordance with this embodiment.

The amorphous silicon film formed on the glass substrate 2101 is thermally crystallized to obtain a crystalline silicon film 2103, and after cooling, the glass substrate 2101 is warped. As shown in FIG. 18A, the glass substrate 2101 is located on the stage 2201.

In FIG. 18B, the warped glass substrate 2101 is forcedly corrected by flattening and mounting the glass substrate formed on the stage 2201, in this example, by the suction inlet 2202. The glass substrate mounted on the stage 2201 is flattened to the degree of about 5 μm in level.

In FIG. 18C, a linear laser beam is irradiated onto the crystalline silicon film 2103 on the glass substrate which has been flattened in the scanning manner.

In this way, with the glass substrate 2101 being flatly mounted, the linear laser beam is uniformly irradiated onto the crystalline silicon film which is a surface to be irradiated without any shift of the focal points regardless of the glass substrate per se being warped.

The irradiation of the laser beam is conducted with the energy density of the laser beam being within 100 mJ/cm$^2$ to 500 mJ/cm$^2$, for example, 370 mJ/cm$^2$. The crystallinity is further enhanced by irradiating a laser beam onto the film with an energy of about 220 mJ/cm$^2$ in advance before the above irradiation of the laser beam, as the two-step irradiation.

The irradiation of the laser beam is conducted while the linear laser beam is being shifted relatively with respect to an object to be irradiated, that is, a crystalline silicon film. A direction in which the linear laser beam is shifted is substantially perpendicular to the linear laser beam (FIG. 14B, h-direction). In this situation, paying an attention to a certain point on the substrate, the laser beam of 2 to 40 shots, for example, 32 shots is irradiated on the substrate. Also, the substrate temperature at the time of irradiating the laser beam is 200° C. (FIG. 1B).

In this way, a crystalline silicon film is fabricated. The crystalline silicon film thus fabricated becomes sufficiently uniform because the dispersion of the mobility within the substrate surface is about ±10%.

In the crystalline silicon film which has been annealed by a laser beam not through the flattening process shown in this embodiment, the dispersion of mobility within the substrate surface is about ±15 to 40%. Thus, the sufficient uniformity. cannot be obtained.

On the basis of the crystalline silicon film thus fabricated, the TFTs of 400×300 pieces within the manufacture area of 40×50 mm$^2$ is fabricated in accordance with the producing process as described in the first embodiment.

The threshold voltage of the TFT is extremely unified within the substrate surface in comparison with the TFT manufactured without flattening the glass substrate, as shown in FIG. 5.

Tenth Embodiment

In the second embodiment, there is shown an example in which the arrangement of the optical system and the structure of the stage are used, which are different from those in the first embodiment.

As in the first embodiment, referring to FIGS. 1A to 1F, an under silicon oxide film 102 having a thickness of 2000 Å is formed on a glass substrate 101 (In this embodiment, there is used a Corning 1737 of 300×300 mm square and 0.7 mm thickness. It is needless to say that another glass substrate such as Corning 7059, OA2, NA45, etc., may be used.), and an amorphous silicon film 103 having a thickness of 500 Å is sequentially formed on the under silicon oxide film 102 by plasma CVD.

Then, nickel acetate aqueous solution of 10 ppm is coated on the surface of silicon, and a nickel acetate layer is formed by spin coating. It is more preferable that a surface active agent is added to the nickel acetate aqueous solution. Since the nickel acetate layer is very thin, although it is not necessarily to be in a film shape, it does not suffer from any problem in the subsequent process (FIG. 1A).

Then, the glass substrate is thermally annealed at 550° C. for four hours, to thereby crystallize the silicon film 103. In this state, nickel serves as the core of crystal, to promote the crystallization of the amorphous silicon film. The strain point of the Corning 1737 substrate is 667° C., and the annealing temperature of 550° C. is below the strain point.

After the thermal crystallization, when the glass substrate is cooled, the silicon film contracts so that the substrate produces the concave warp.

That the processing can be made at a low temperature (the strain point of the Corning 1737 or less) for a short period of time, that is, at 550° C. for four hours is caused by the function of nickel. The details are disclosed in Japanese Patent Unexamined Publication No. 6-244104. The publication discloses that the thermal annealing, for example, at 550° C. (below the strain point) for four hours is conducted so that the temperature in thermally annealing does not exceed the strain point of the glass substrate. However, the temperature is determined so that the glass substrate 101 is prevented from being remarkably deformed in thermally crystallizing.

In this state, the glass substrate is curved along the surface on which the crystalline silicon film is formed, into a concave portion.

In this example, a difference in level between the central portion and the peripheral portion of the glass substrate is about 200 μm. The degree of the warp is different depending upon the size, the thickness and the kind of the glass substrate.

In order to further enhance the crystallinity of the crystalline silicon film, an excimer laser beam which is a high-power pulse laser is irradiated onto the film.

Figure 6C:
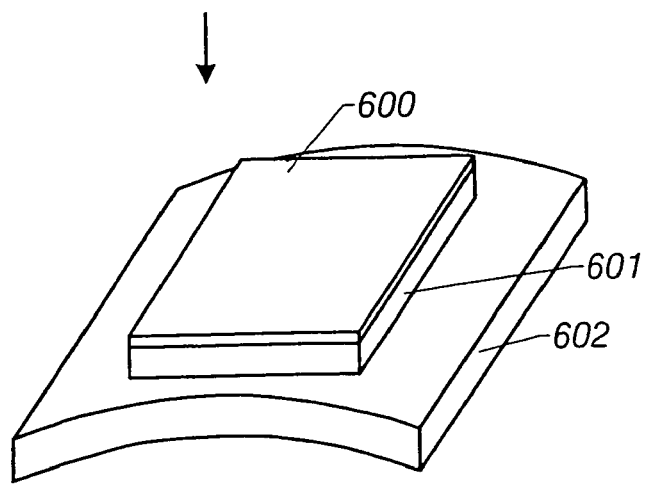
Figure 7A:
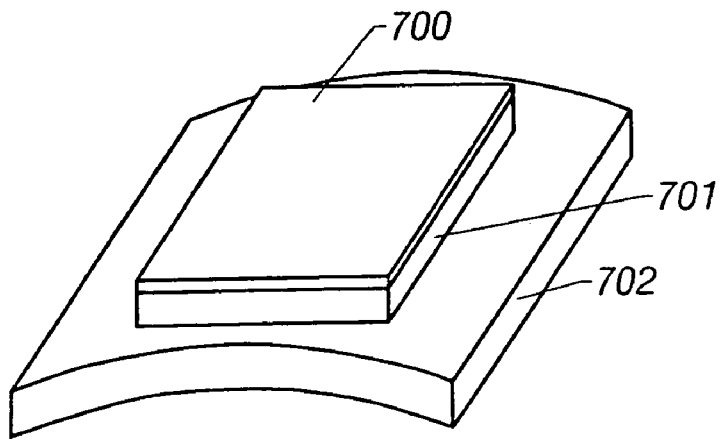
FIGS. 7A to 7C show the producing method of the embodiment.
Figure 7B:
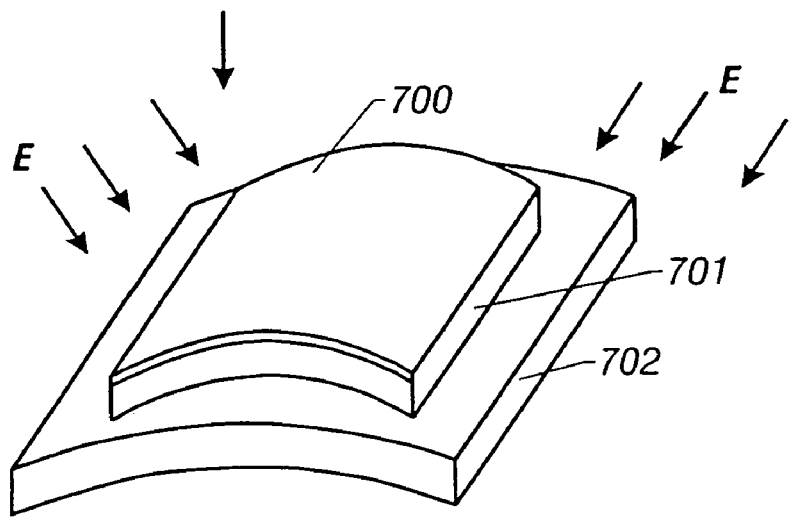
Figure 7C:
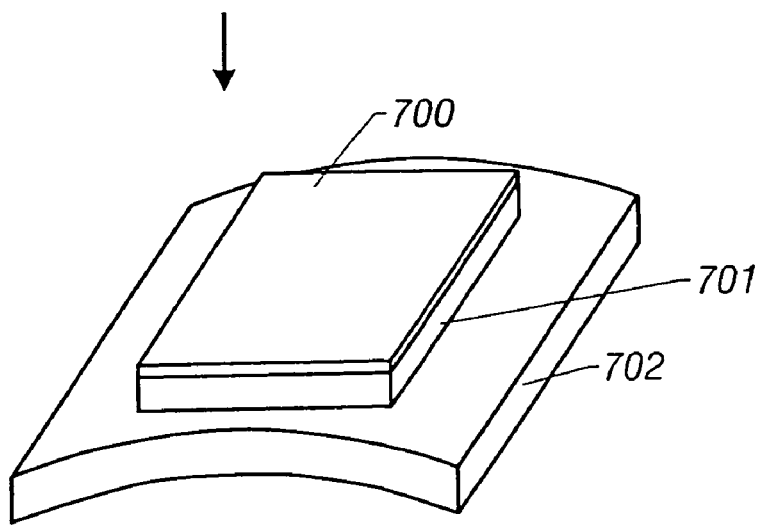

The laser annealing unit has the structure shown in FIG. 6 as in the first embodiment.

An oscillator as used is an EX748 made by LUMNICS Corporation. The laser beam oscillated from the oscillator is a KrF excimer laser beam (248 nm in wavelength and 25 ns in pulse width).

Another excimer laser as well as another type laser can be used. It should be noted that a laser beam of a pulse oscillator need to be used.

The oscillated laser beam is introduced into an optical system as shown in FIGS. 14A and 14B in order to deform the beam shape.

The laser beam immediately before being shone onto the optical system is rectangular to the degree of 3×2 cm$^2$, but it is processed by the optical system into a slender beam (linear beam) of about 10 to 30 cm in length and 0.01 to 0.3 cm in width. The energy of the laser beam that has passed through the optical system is 800 mJ/shot at the maximum.

The reason why the laser beam is processed into such a slender beam is to improve the processability. When the linear beam is irradiated onto an sample, if the length of the laser beam is longer than the width of the sample, then the sample is moved in one direction, thereby irradiating a laser beam onto the entire sample.

Even though the length of the beam is shorter than the width of the sample, troublesomeness in processing is saved in comparison with the rectangular beam. However, in this case, there occurs the necessity of moving the beam back and forth, right and left relatively with respect to the sample.

The stage (base) for the substrate (sample) on which a laser beam is irradiated is controlled by a computer and so designed as to be moved perpendicularly (FIG. 8, I-direction) to the line direction of the linear laser beam.

If the stage is provided with a function for moving in the line direction of the laser beam, even though the beam width is shorter than the sample, a laser processing on the entire sample is enabled.

The optical system that processes a laser beam into a linear laser beam may be the same as that in other embodiments.

The optical system is not limited if it can deform a laser beam into the beam shape required by the present invention.

The laser beam is shaped into a linear form, and the area of a laser beam on the surface to be irradiated is 300 mm×1 mm. The width of the linear laser beam is half of the maximum energy value of the laser beam.

The glass substrate warped in the form of a concave through the thermally crystallizing process is forcedly flattened and fixed by the stage (base) of the laser annealing unit.

In this example, the stage having the structure shown in FIG. 17D is used. In FIG. 17D, the pusher 232 in this example is made of ceramic, but it may be made of metal, quartz or the like. It is desirable that it may be made of a material high in heat resistance and hard in thermal expansion.

The pusher 232, when the glass substrate 101 is transferred and mounted on the stage 231, is automatically pressed on the upper peripheral portion of the glass substrate 101 in such a manner that the glass substrate 101 is fixedly brought in close contact with the stage.

The glass substrate 101 is flattened in accordance with the flat surface of the stage 231 and fixed thereto. The flattened glass substrate is about 10 μm in a difference in level within the surface.

In this manner, a laser beam is irradiated onto the glass substrate located on the stage (base).

The irradiation of the laser beam is conducted while the linear laser beam is being shifted relatively with respect to an object to be irradiated, that is, a crystalline silicon film. A direction in which the linear laser beam is shifted is substantially perpendicular to the linear laser beam (FIG. 13B, I-direction). In this situation, paying an attention to a certain point on the substrate, the laser beam of 2 to 20 shots, for example, 15 shots is irradiated on the substrate.

The irradiation of the laser beam is conducted with the energy density of the laser beam being within 100 mJ/cm$^2$ to 500 mJ/cm$^2$, for example, 370 mJ/cm$^2$. The crystallinity is further enhanced by irradiating a laser beam onto the film with an energy of about 220 mJ/cm$^2$ in advance before the above irradiation of the laser beam, as the two-step irradiation.

Also, the substrate temperature at the time of irradiating the laser beam is 200° C. (FIG. 1B).

Moreover, in this example, the atmospheric control is not particularly conducted, and the irradiation of the laser beam is conducted in the atmosphere. It may be conducted under the vacuum or the atmosphere of an inactive gas such as argon or helium, hydrogen or nitrogen.

In this way, the crystalline silicon film having the uniform crystallinity within the substrate surface can be obtained.

Thereafter, a TFT is fabricated using the crystalline silicon film as in the first embodiment.

The threshold voltage of the TFT is extremely unified within the substrate surface in comparison with the TFT manufactured without flattening the glass substrate.

In the present invention, the substrate on which the film has been formed can be restrained from being warped after being heated and cooled, whereby the substrate can be flattened.

In the present invention, the glass substrate on which the crystalline silicon film is formed can be flattened, and the crystalline silicon film having the uniform and high crystallinity within the substrate surface can be obtained even after the laser irradiation process.

The crystalline silicon TFT uniform in the threshold value voltage within the substrate surface can be fabricated.

The present invention is effective particularly in the case where the area of the glass substrate is large in producing a large number of TFTs on the glass substrate.

In forming a liquid crystal display using the glass substrate, the cell pair can be made readily and surely since the substrate is flat.

As described above, the present invention is useful from the industrial viewpoint.

What is claimed is:

1. An apparatus of manufacturing a semiconductor device comprising:
   an oscillator configured to emit a laser beam;
   an optical system comprising a cylindrical lens which processes the laser beam into a linear laser beam having a trapezoidal energy distribution in a width direction, the trapezoidal energy distribution satisfying inequalities $0.5L1 \leq L2 \leq L1$ and $0.5L1 \leq L3 \leq L1$ on a surface to be irradiated where, assuming that a maximum energy is 1, L1 is a first beam width of two points having an energy of 0.95 and L1+L2+L3 is a second beam width of two points having an energy of 0.70, with L2 and L3 occupying two peripheral portions of the first beam width; and
   a stage for flattening and mounting a substrate on which the surface to be irradiated is provided, the stage comprising a plurality of suction inlets,
   wherein the stage is configured to move in the width direction of the linear laser beam during irradiation of the linear laser beam.

2. A laser annealing apparatus comprising:
   an oscillator configured to emit a laser beam;
   an optical system comprising a cylindrical lens which processes the laser beam into a linear laser beam having a trapezoidal energy distribution in a width direction, the trapezoidal energy distribution satisfying inequalities $0.5L1 \leq L2 \leq L1$ and $0.5L1 \leq L3 \leq L1$ on a surface to be irradiated where, assuming that a maximum energy is 1, L1 is a first beam width of two points having an energy of 0.95 and L1+L2+L3 is a second beam width of two points having an energy of 0.70, with L2 and L3 occupying two peripheral portions of the first beam width;
   a stage having a flat surface for mounting a substrate on which the surface to be irradiated is provided; and
   means for contacting a lower surface of the substrate with the flat surface of the stage,
   wherein the stage is configured to move in the width direction of the linear laser beam during irradiation of the linear laser beam.

3. A laser annealing apparatus comprising:
   an oscillator configured to emit a laser beam;
   an optical system comprising a cylindrical lens which processes the laser beam into a linear laser beam having a trapezoidal energy distribution in a width direction, the trapezoidal energy distribution satisfying inequalities $0.5L1 \leq L2 \leq L1$ and $0.5L1 \leq L3 \leq L1$ on a surface to be irradiated where, assuming that a maximum energy is 1, L1 is a first beam width of two points having an energy of 0.95 and L1+L2+L3 is a second beam width of two points having an energy of 0.70, with L2 and L3 occupying two peripheral portions of the first beam width;
   a stage for mounting and flattening a substrate on which the surface to be irradiated is provided; and means for pressing an upper surface of the substrate, wherein the stage is configured to move in the width direction of the linear laser beam during irradiation of the linear laser beam.

4. A laser annealing apparatus comprising:

an oscillator configured to emit a laser beam;

an optical system comprising a cylindrical lens which processes the laser beam into a linear laser beam having a trapezoidal energy distribution in a width direction, the trapezoidal energy distribution satisfying inequalities $0.5L1 \leq L2 \leq L1$ and $0.5L1 \leq L3 \leq L1$ on a surface to be irradiated where, assuming that a maximum energy is 1, L1 is a first beam width of two points having an energy of 0.95 and L1+L2+L3 is a second beam width of two points having an energy of 0.70, with L2 and L3 occupying two peripheral portions of the first beam width; and a stage for flattening and mounting a substrate on which the surface to be irradiated is provided, the stage comprising a plurality of suction inlets, wherein the stage is configured to move with respect to the linear laser beam during irradiation of the linear laser beam.

5. A laser annealing apparatus comprising:

an oscillator configured to emit a laser beam;

an optical system comprising a cylindrical lens which processes the laser beam into a linear laser beam having a trapezoidal energy distribution in a width direction, the trapezoidal energy distribution satisfying inequalities $0.5L1 \leq L2 \leq L1$ and $0.5L1 \leq L3 \leq L1$ on a surface to be irradiated where, assuming that a maximum energy is 1, L1 is a first beam width of two points having an energy of 0.95 and L1+L2+L3 is a second beam width of two points having an energy of 0.70, with L2 and L3 occupying two peripheral portions of the first beam width;

a stage for flattening and mounting a substrate on which the surface to be irradiated is provided; and means for contacting a lower surface of the substrate with a flat surface of the stage, wherein the stage is configured to move with respect to the linear laser beam during irradiation of the linear laser beam.

6. A laser annealing apparatus comprising:

an oscillator configured to emit a laser beam;

an optical system comprising a cylindrical lens which processes the laser beam into a linear laser beam having a trapezoidal energy distribution in a width direction, the trapezoidal energy distribution satisfying inequalities $0.5L1 \leq L2 \leq L1$ and $0.5L1 \leq L3 \leq L1$ on a surface to be irradiated where, assuming that a maximum energy is 1, L1 is a first beam width of two points having an energy of 0.95 and L1+L2+L3 is a second beam width of two points having an energy of 0.70, with L2 and L3 occupying two peripheral portions of the first beam width;

a stage for flattening and mounting a substrate on which the surface to be irradiated is provided; and means for pressing an upper surface of the substrate, wherein the stage is configured to move with respect to the linear laser beam during irradiation of the linear laser beam.

7. The apparatus of manufacturing a semiconductor device according to claim 1, wherein the substrate is a glass substrate.

8. The laser annealing apparatus according to claim 2, wherein the substrate is a glass substrate.

9. The laser annealing apparatus according to claim 3, wherein the substrate is a glass substrate.

10. The laser annealing apparatus according to claim 4, wherein the substrate is a glass substrate.

11. The laser annealing apparatus according to claim 5, wherein the substrate is a glass substrate.

12. The laser annealing apparatus according to claim 6, wherein the substrate is a glass substrate.

13. The apparatus of manufacturing a semiconductor device according to claim 1, wherein the stage comprises quartz.

14. The laser annealing apparatus according to claim 2, wherein the stage comprises quartz.

15. The laser annealing apparatus according to claim 3, wherein the stage comprises quartz.

16. The laser annealing apparatus according to claim 4, wherein the stage comprises quartz.

17. The laser annealing apparatus according to claim 5, wherein the stage comprises quartz.

18. The laser annealing apparatus according to claim 6, wherein the stage comprises quartz.

19. The apparatus of manufacturing a semiconductor device according to claim 1, wherein a surface of the stage has a roughness and waviness of 5 μm or less.

20. The laser annealing apparatus according to claim 2, wherein a surface of the stage has a roughness and waviness of 5 μm or less.

21. The laser annealing apparatus according to claim 3, wherein a surface of the stage has a roughness and waviness of 5 μm or less.

22. The laser annealing apparatus according to claim 4, wherein a surface of the stage has a roughness and waviness of 5 μm or less.

23. The laser annealing apparatus according to claim 5, wherein a surface of the stage has a roughness and waviness of 5 μm or less.

24. The laser annealing apparatus according to claim 6, wherein a surface of the stage has a roughness and waviness of 5 μm or less.

* * * * *